US012119362B2

(12) United States Patent
Shishido et al.

(10) Patent No.: US 12,119,362 B2
(45) Date of Patent: Oct. 15, 2024

(54) LIGHT SENSOR INCLUDING LONG-PASS FILTER AND LIGHT DETECTION SYSTEM

(71) Applicant: Panasonic Intellectual Property Management Co., Ltd., Osaka (JP)

(72) Inventors: Sanshiro Shishido, Osaka (JP); Shinichi Machida, Osaka (JP); Takeyoshi Tokuhara, Osaka (JP); Katsuya Nozawa, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 718 days.

(21) Appl. No.: 17/185,129

(22) Filed: Feb. 25, 2021

(65) Prior Publication Data

US 2021/0202558 A1 Jul. 1, 2021

Related U.S. Application Data

(63) Continuation-in-part of application No. PCT/JP2019/041829, filed on Oct. 25, 2019.

(30) Foreign Application Priority Data

Nov. 19, 2018 (JP) ................................. 2018-216498

(51) Int. Cl.
*H01L 27/14* (2006.01)
*G02B 5/20* (2006.01)
(Continued)

(52) U.S. Cl.
CPC ........ *H01L 27/14625* (2013.01); *G02B 5/208* (2013.01); *H01L 27/14621* (2013.01);
(Continued)

(58) Field of Classification Search
CPC ......... H01L 27/14625; H01L 27/14621; H01L 27/14627; H01L 27/14667;
(Continued)

(56) References Cited

U.S. PATENT DOCUMENTS 10,873,032 B2 * 12/2020 Miyashita ............ H10K 85/633
2008/0079807 A1 * 4/2008 Inuiya ................... H04N 23/11
348/70
(Continued)

FOREIGN PATENT DOCUMENTS

CN 111103727 A 5/2020
JP 5-343728 12/1993
(Continued)

OTHER PUBLICATIONS

International Search Report of PCT application No. PCT/JP2019/041829 dated Dec. 10, 2019.
(Continued)

*Primary Examiner* — Ida M Soward
(74) *Attorney, Agent, or Firm* — Rimon P.C.

(57) ABSTRACT

A light sensor includes a photoelectric conversion layer and a long-pass filter that is disposed above the photoelectric conversion layer. The photoelectric conversion layer has a spectral sensitivity characteristic having a first peak at a first wavelength that is longer than a cut-on wavelength of the long-pass filter, and a spectral sensitivity of the photoelectric conversion layer at the cut-on wavelength is greater than or equal to 0% and less than or equal to 50% of a spectral sensitivity of the photoelectric conversion layer at the first wavelength.

19 Claims, 14 Drawing Sheets

(51) Int. Cl.
*H01L 27/146* (2006.01)
*H01L 31/0352* (2006.01)
*H01L 31/0384* (2006.01)
*H01L 27/142* (2014.01)
*H01L 31/0256* (2006.01)

(52) U.S. Cl.
CPC .. *H01L 27/14627* (2013.01); *H01L 27/14667* (2013.01); *H01L 31/035218* (2013.01); *H01L 31/035227* (2013.01); *H01L 31/03845* (2013.01); *H01L 27/142* (2013.01); *H01L 27/14643* (2013.01); *H01L 2031/0344* (2013.01)

(58) Field of Classification Search
CPC ......... H01L 27/14605; H01L 27/14612; H01L 27/14636; H01L 27/14643; H01L 27/142; H01L 31/035218; H01L 31/035227; H01L 31/03845; H01L 31/02325; H01L 2031/0344; G02B 5/208
See application file for complete search history.

(56) References Cited

U.S. PATENT DOCUMENTS

| | | | | |
|---|---|---|---|---|
| 2008/0230123 | A1* | 9/2008 | Mitsui | H10K 39/32 257/E51.026 |
| 2010/0123070 | A1* | 5/2010 | Natori | H04N 23/11 250/226 |
| 2011/0180688 | A1* | 7/2011 | Nakahara | H01L 27/14696 257/E31.015 |
| 2011/0284980 | A1* | 11/2011 | Sakoh | H01L 27/14645 257/E31.127 |
| 2012/0217477 | A1 | 8/2012 | So et al. | |
| 2014/0103477 | A1* | 4/2014 | Toda | H01L 31/0322 257/446 |
| 2015/0357361 | A1 | 12/2015 | Kajiyama et al. | |
| 2016/0035921 | A1 | 2/2016 | Matsuda et al. | |
| 2016/0061730 | A1* | 3/2016 | Tagawa | G01N 21/645 378/44 |
| 2016/0373652 | A1 | 12/2016 | Ando et al. | |
| 2017/0347086 | A1* | 11/2017 | Watanabe | G06T 7/521 |
| 2018/0047788 | A1 | 2/2018 | Nozawa | |
| 2018/0132706 | A1 | 5/2018 | Nagae | |
| 2018/0204882 | A1 | 7/2018 | Segawa et al. | |
| 2018/0227525 | A1* | 8/2018 | Shishido | H10K 39/32 |
| 2019/0081106 | A1* | 3/2019 | Nakata | H04N 25/76 |
| 2019/0141273 | A1* | 5/2019 | Machida | H10K 39/32 |
| 2019/0293848 | A1 | 9/2019 | Morimitsu | |
| 2019/0297278 | A1* | 9/2019 | Sumi | G02B 5/281 |
| 2020/0133078 | A1 | 4/2020 | Kim et al. | |

FOREIGN PATENT DOCUMENTS

| | | |
|---|---|---|
| JP | 8-195504 | 7/1996 |
| JP | 2009-162508 | 7/2009 |
| JP | 2014-515177 | 6/2014 |
| JP | 2014-135571 | 7/2014 |
| JP | 2014-177418 | 9/2014 |
| JP | 2014-222709 A | 11/2014 |
| JP | 2016-021488 | 2/2016 |
| JP | 2017-038011 | 2/2017 |
| JP | 2017-053890 | 3/2017 |
| JP | 2017-188917 | 10/2017 |
| JP | 2018-054632 | 4/2018 |
| JP | 2018-098345 | 6/2018 |
| WO | 2017/011628 A1 | 1/2017 |

OTHER PUBLICATIONS

The Extended European Search Report dated Mar. 1, 2022 for the related European Patent Application No. 19886350.8.
English Translation of Chinese Search Report dated Nov. 6, 2023 for the related Chinese Patent Application No. 201980042953.5.

* cited by examiner ary configuration of a camera system;
LIGHT SENSOR INCLUDING LONG-PASS FILTER AND LIGHT DETECTION SYSTEM

BACKGROUND

1. Technical Field

The present disclosure relates to a light sensor and a light detection system.

2. Description of the Related Art

In the field of imaging devices, there is a demand for limited-wavelength imaging for application to, for example, sensing such as fluorescence lifetime measurement, substance identification, or distance measurement. In such an application, imaging based on a desirable wavelength is generally performed by using a combination of an imaging unit having a broad sensitivity characteristic and an optical filter that limits wavelength and that is placed in front of the imaging unit. For example, Japanese Unexamined Patent Application Publication No. 2017-053890 discloses an imaging device in which a narrow-band-pass filter is disposed in front of an imaging element and thus the contrast of an image about fluorescent light is improved. Japanese Unexamined Patent Application Publication No. 05-343728 discloses a light receiving element that selectively has sensitivity to light having a wavelength of about 1.35 µm by disposing, above a light absorbing layer made of InGaAsP, a filter layer that is made of InGaAsP and that transmits light having a wavelength greater than or equal to 1.35 µm.

SUMMARY

One non-limiting and exemplary embodiment provides a light sensor including: a photoelectric conversion layer; and a long-pass filter that is disposed above the photoelectric conversion layer and that selectively transmits a component of incident light, the component having a wavelength longer than or equal to a cut-on wavelength of the long-pass filter. The photoelectric conversion layer has a spectral sensitivity characteristic having a first peak at a first wavelength that is longer than the cut-on wavelength of the long-pass filter. A spectral sensitivity of the photoelectric conversion layer at the cut-on wavelength is greater than or equal to 0% and less than or equal to 50% of a spectral sensitivity of the photoelectric conversion layer at the first wavelength.

General or specific embodiments may be implemented as an element, a device, an apparatus, a system, an integrated circuit, a method, or a computer program. General or specific embodiments may be implemented as any combination of an element, a device, an apparatus, a system, an integrated circuit, a method, and a computer program.

Additional benefits and advantages of the disclosed embodiments will become clear from the specification and the drawings. The benefits and/or advantages of the disclosed embodiments are individually provided by the various embodiments and features disclosed in the specification and drawings, which need not all be provided in order to obtain one or more of such effects and/or advantages.

DETAILED DESCRIPTION

Figure 22:
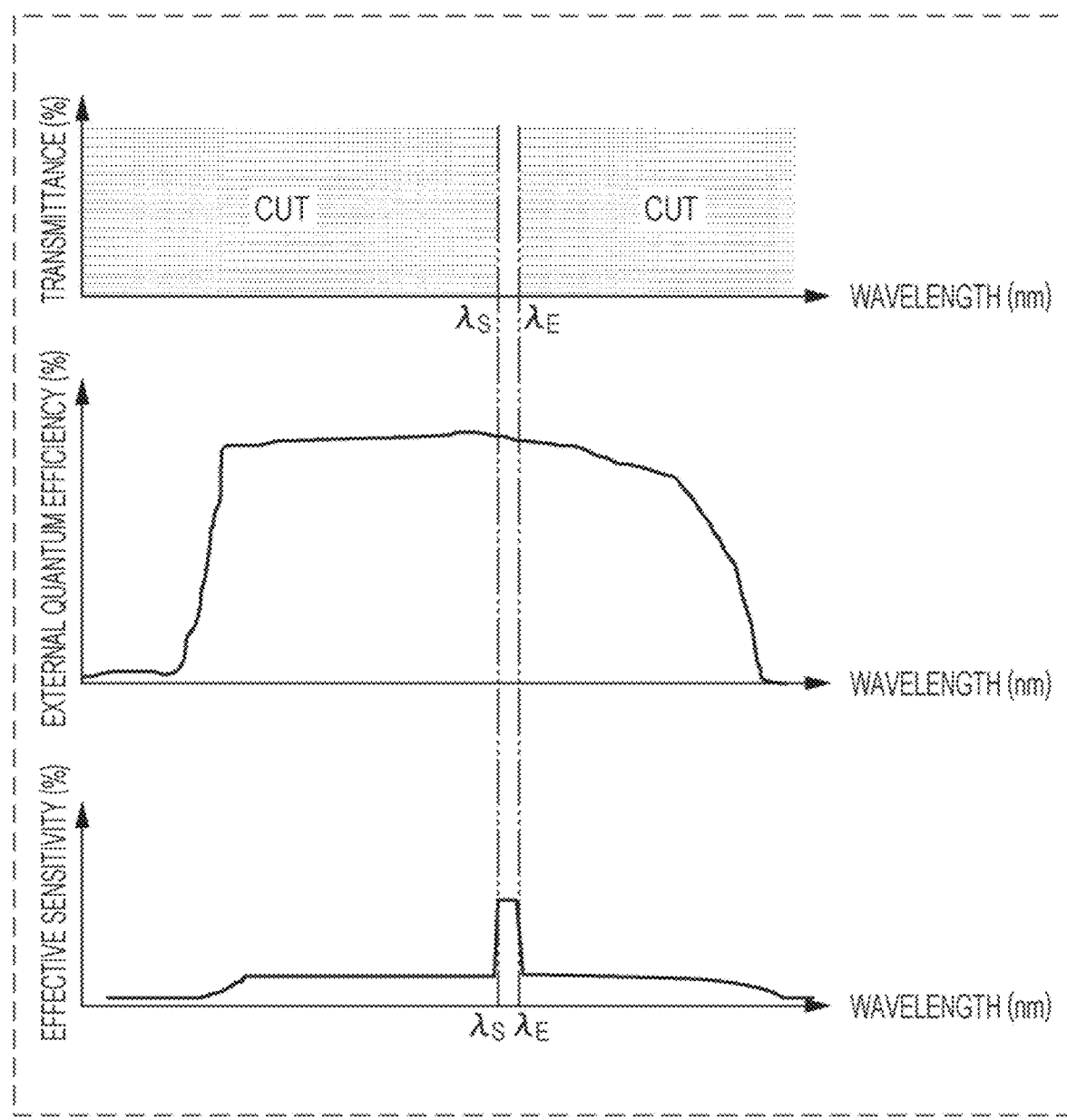
FIG. 22 illustrates, as a comparative example in existing narrow-band imaging, graphs of an exemplary transmission spectrum of an optical filter, a spectral sensitivity curve about an imaging element, and an effective sensitivity characteristic about the imaging element.

Before describing embodiments according to the present disclosure, problems about existing narrow-band imaging that the inventors have found will be described. FIG. 22 illustrates, as a comparative example in existing narrow-band imaging, graphs of an exemplary transmission spectrum of an optical filter, a spectral sensitivity curve about an imaging element, and an effective sensitivity characteristic about the imaging element.

As described above, with the technology described in Japanese Unexamined Patent Application Publication No. 2017-053890, a band-pass filter is disposed in front of an imaging element in order to perform narrow-band imaging. A CMOS image sensor is used as the imaging element. As illustrated in the second graph from the top of FIG. 22, the spectral sensitivity characteristic of the CMOS image sensor is generally broad. By disposing the band-pass filter in front of the CMOS image sensor, the wavelength of light incident on the CMOS image sensor is limited to the range from $\lambda S$ to $\times E$ shown in the figure. As a result, as illustrated in the third graph from the top of FIG. 22, the imaging device as a whole has sensitivity to light in the range of approximately $\lambda S$ to $\lambda E$.

However, the band-pass filter, which is generally an optical multilayer film, attenuates unnecessary wavelength components by interference. Therefore, the band-pass filter may be incapable of performing an intended band-pass function for oblique light. This causes a problem in that the light intensity in a peripheral part of an imaging region is lower than that in a central part of the imaging region. Moreover, such a characteristic is disadvantageous also in a combination with a wide-angle lens. Although it may be possible to improve filter characteristics by stacking a plurality of optical filters or by using a prism, the former method reduces transmittance even in a desirable wavelength range, and the latter method makes it difficult to reduce the size of equipment.

The second graph from the top of FIG. 22 illustrates an example of a spectral sensitivity curve about InGaAs. As illustrated in the second graph from the top of FIG. 22, in general, a solid crystal such as InGaAs, InGaAsP, or Si has absorptance in a wide wavelength range. It is known that the wavelength at which a photodiode using such a solid crystal has absorptance shifts depending on temperature. The reason for this is explained as follows. In solid crystals, such as Si, InGaAs, and InGaAsP, atoms in more than or equal to the Avogadro's number are regularly arranged with special periodicity. Therefore, an energy level of a solid crystal forms a band having a width. The band structure is modulated due to electron lattice interaction and due to a large variation in lattice spacing depending on temperature. As a result, the wavelength at which the photodiode has absorptance shifts depending on temperature. For example, a cut-off wavelength at which the sensitivity of the photodiode falls sharply may shift depending on ambient temperature. Thus, the photodiode using a solid crystal has temperature dependency with respect to a wavelength at which the photodiode has absorptance. As a result, the robustness of the photodiode against temperature may not be sufficient in application to narrow-band imaging.

In general, the light-blocking ratio of a band-pass filter is not 100%. Therefore, when a photodiode made of a material that has a broad absorption property is used, because the material of the photodiode has relatively high sensitivity in a broad range, even if a band-pass filter is disposed in front of the photodiode, it may not be possible to sufficiently reduce effective sensitivity outside of the desirable wavelength range from $\lambda S$ to $\lambda E$, as illustrated in the third graph from the top of FIG. 22. However, if the light-blocking ratio of a band-pass filter is increased, sensitivity in the desirable wavelength range from $\lambda S$ to $\lambda E$ may also decrease.

With the technology described in Japanese Unexamined Patent Application Publication No. 05-343728, a filter layer as a long-pass filter is disposed in front of a light absorbing layer made of InGaAsP. However, as with the band-pass filter, the light-blocking ratio of a long-pass filter at wavelengths shorter than the cut-on wavelength is not 100%. Accordingly, it is difficult to sufficiently reduce sensitivity about unnecessary wavelength components.

An overview of one aspect of the present disclosure is as follows.

[Item 1] A light sensor according to an item 1 of the present disclosure includes a photoelectric conversion layer and a long-pass filter that is disposed above the photoelectric conversion layer and that selectively transmits a component of incident light, the component having a wavelength longer than or equal to a cut-on wavelength of the long-pass filter. The photoelectric conversion layer has a spectral sensitivity characteristic having a first peak at a first wavelength that is longer than the cut-on wavelength of the long-pass filter. A spectral sensitivity of the photoelectric conversion layer at the cut-on wavelength is greater than or equal to 0% and less than or equal to 50% of a spectral sensitivity of the photoelectric conversion layer at the first wavelength.

With the configuration according to Item 1, it is possible to perform imaging about a specific wavelength without requiring a narrow-band-pass filter. Accordingly, it is possible to provide, at low cost, a light sensor that can perform narrow-band imaging.

[Item 2] In the sensor described in Item 1, the spectral sensitivity of the photoelectric conversion layer at the cut-on wavelength may be greater than or equal to 0% and less than or equal to 30% of the spectral sensitivity of the photoelectric conversion layer at the first wavelength.

[Item 3] In the light sensor described in Item 2, the spectral sensitivity of the photoelectric conversion layer at the cut-on wavelength may be greater than or equal to 0% and less than or equal to 10% of the spectral sensitivity of the photoelectric conversion layer at the first wavelength.

[Item 4] In the light sensor according to any one of Items 1 to 3, a full width at half maximum of the first peak may be less than or equal to 200 nm.

[Item 5] In the light sensor described in Item 4, a width of the first peak at a position where a spectral sensitivity may be 10% of the spectral sensitivity at the first wavelength is less than or equal to 200 nm.

The configuration according to Item 5 is advantageous in narrow-band imaging.

[Item 6] In the light sensor according to any one of Items 1 to 5, the spectral sensitivity characteristic may have a plurality of peaks including the first peak, and the first peak may be a peak that is positioned at a longest wavelength among the plurality of peaks.

[Item 7] In the light sensor described in Item 6, the plurality of peaks may include a second peak positioned at a second wavelength, the second wavelength may be shorter than the cut-on wavelength of the long-pass filter, and the second peak may be a peak that is positioned at a second longest wavelength among the plurality of peaks.

With the configuration according to Item 7, it is possible to provide a light sensor that effectively has no sensitivity to the second wavelength corresponding to the second peak.

[Item 8] In the light sensor according to Item 7, a difference between the first wavelength and the cut-on wavelength may be less than a difference between the cut-on wavelength and the second wavelength.

With the configuration according to Item 8, it is possible to effectively eliminate unwanted sensitivity outside of a narrow target range, which is advantageous for narrow-band imaging.

[Item 9] In the light sensor according to any one of Items 1 to 8, the photoelectric conversion layer may contain a carbon nanotube.

With the configuration according to Item 9, because the density of states is discrete, a peak of the spectral sensitivity curve of a photoelectric conversion layer made of such a material has a sharp shape, and it is possible to form a pixel that specifically has high sensitivity at a specific wavelength.

[Item 10] In the light sensor according to any one of Items 1 to 8, the photoelectric conversion layer may contain a quantum dot.

With the configuration according to Item 10, because the density of states is discrete, a peak of the spectral sensitivity curve of a photoelectric conversion layer made of such a material has a sharp shape, and it is possible to form a pixel that specifically has high sensitivity at a specific wavelength.

[Item 11] In the light sensor according to any one of Items 1 to 10, the first wavelength may be longer than or equal to 1300 nm and shorter than or equal to 1500 nm.

With the configuration according to Item 11, because it is possible to perform imaging based on a wavelength in a gap in the spectrum of sunlight, it is possible to reduce the effect of noise such as sunlight.

[Item 12] In the light sensor according to any one of Items 1 to 11, the long-pass filter may be an absorptive optical filter.

With the configuration according to Item 12, it is possible to perform an intended filter function even for oblique light, and to manufacture a long-pass filter at lower cost than an interference optical filter.

[Item 13] A light detection system according to Item 13 of the present disclosure includes a light source that emits light toward a subject and a light sensor that detects light from the subject. The light sensor includes a photoelectric conversion layer, and a long-pass filter that is disposed above the photoelectric conversion layer and that selectively transmits a component of incident light, the component having a wavelength longer than or equal to a cut-on wavelength of the long-pass filter. The photoelectric conversion layer has a spectral sensitivity characteristic having a first peak at a first wavelength that is longer than the cut-on wavelength of the long-pass filter. A spectral sensitivity of the photoelectric conversion layer at the cut-on wavelength is greater than or equal to 0% and less than or equal to 50% of a spectral sensitivity of the photoelectric conversion layer at the first wavelength. The light source emits light having the first wavelength.

[Item 14] In the light detection system according to Item 13, a full width at half maximum of the first peak may be greater than or equal to 200 nm and less than or equal to 300 nm.

[Item 15] In the light detection system according to Item 13 or 14, a full width at half maximum of an emission peak of light emitted by the light source may be greater than a full width at half maximum of the first peak.

Hereafter, embodiments of the present disclosure will be described in detail with reference to the drawings. The embodiments described below are general or specific examples. Values, shapes, materials, constituent elements, arrangements and connection patterns of constituent elements, steps, and the orders of the steps in the embodiments described below are examples and do limit the present disclosure. Various aspects described in the present specification may be combined with each other unless contradiction arises. Constituent elements that are described in the following embodiments and that are not described in an independent claim representing the highest concept are described as optional constituent elements. In the following description, constituent elements having substantially the same function will be denoted by the same numerals, and descriptions of such constituent elements may be omitted. To avoid excessive complexity of the drawings, illustrations of some elements may be omitted.

(Embodiment of Light Sensor)

Figure 1:
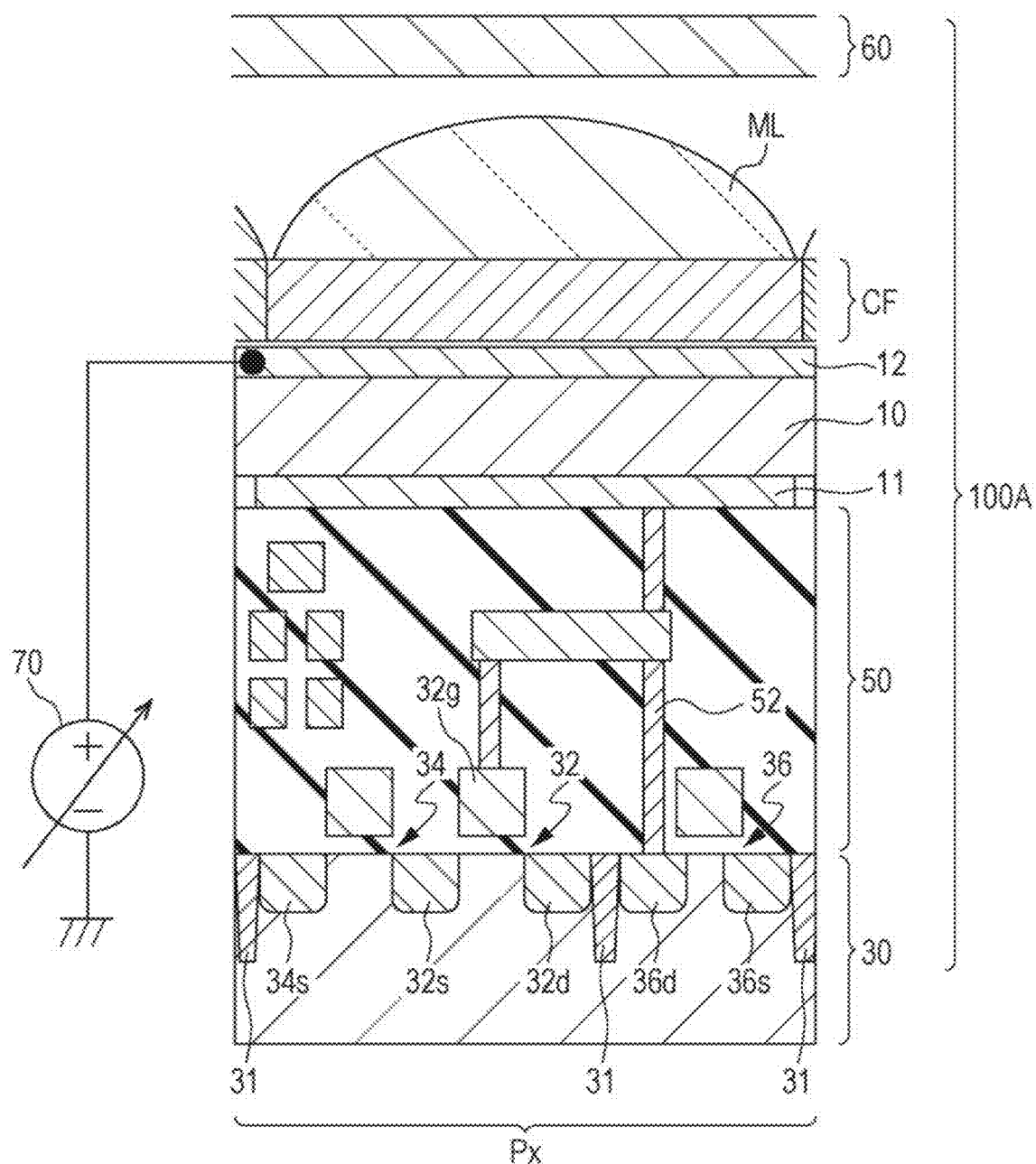
FIG. 1 is a schematic sectional view illustrating the device structure of a pixel of a light sensor according to an embodiment of the present disclosure.

FIG. 1 illustrates the device structure of a pixel of a light sensor according to an embodiment of the present disclosure. FIG. 1 schematically illustrates a cross section of a part of a light sensor 100A according to an embodiment of the present disclosure. Schematically, the light sensor 100A includes a pixel Px, which includes a photoelectric conversion layer 10, and a long-pass filter 60.

The long-pass filter 60, which is shown above the photoelectric conversion layer 10 in FIG. 1, is disposed in front of the photoelectric conversion layer 10 and transmits a component of incident light, the component having a wavelength greater than or equal to a cut-on wavelength. The photoelectric conversion layer 10 receives light that has passed through the long-pass filter 60. As described below in detail, the photoelectric conversion layer 10 contains a material that exhibits a quantum confinement effect, such as a carbon nanotube or a quantum dot. Thus, the photoelectric conversion layer 10 has a spectral sensitivity characteristic having a first peak at a wavelength longer than the cut-on wavelength of the long-pass filter 60. Therefore, it is possible to perform imaging about light having a specific wavelength, such as a wavelength in the near-infrared range, without requiring a narrow-band-pass filter. In the present specification, electromagnetic radiation in general, including infrared radiation and ultraviolet radiation, will be referred to as "light" for convenience.

(Device Structure of Pixel Px)

Referring to FIG. 1, the device structure of the pixel Px will be described. As illustrated in FIG. 1, the light sensor 100A includes a plurality of pixels Px. The plurality of pixels Px form an imaging region by being arranged, for example, two-dimensionally. The long-pass filter 60 is disposed on a side of the plurality of pixels Px on which light is incident on the plurality of pixels Px. The number and arrangement of pixels Px in the light sensor according to an embodiment of the present disclosure are not limited to those illustrated in FIG. 1 and may be any appropriate number and arrangement. If the pixels Px are arranged one-dimensionally, the light sensor 100A can be used, for example, as a line sensor. If the light sensor includes at least one pixel Px, the light sensor can be used for detection of light.

As illustrated in the figure, each of the plurality of pixels Px includes a part of a semiconductor substrate 30 and a part of a photoelectric converter 10L supported by the semiconductor substrate 30. As described below, a detection circuit including a signal detection transistor 32 and the like is formed on the semiconductor substrate 30. The photoelectric converter 10L is positioned on an insulation layer 50 that covers the detection circuit on the semiconductor substrate 30, and is connected to the detection circuit on the semiconductor substrate 30 via a conductive structure 52 disposed in the insulation layer 50. That is, the pixel Px of the light sensor 100A has a device structure similar to that of a so-called stacked imaging device. For example, Japanese Unexamined Patent Application Publication No. 2017-188917 describes a fundamental structure and an operation about a stacked imaging device. For reference, the entire contents of Japanese Unexamined Patent Application Publication No. 2017-188917 are incorporated in the present specification.

The photoelectric converter 10L includes a pixel electrode 11, a counter electrode 12, and the photoelectric conversion layer 10 disposed between these electrodes. The counter electrode 12 is disposed in the photoelectric converter 10L on a side opposite to the semiconductor substrate 30, in other words, a side on which light is incident. In this example, a microlens ML is disposed above the photoelectric converter 10L so as to correspond to each pixel Px. A protective layer may be interposed between the microlens ML and the counter electrode 12 of the photoelectric converter 10L. As illustrated as an example in FIG. 1, an optical member such as a color filter CF may be disposed between the microlens ML and the counter electrode 12 of the photoelectric converter 10L.

The photoelectric conversion layer 10 receives incident light and generates a charge pair of a negative charge and a positive charge, such as a hole-electron pair. As described below, as the material of the photoelectric conversion layer 10, a material that has a spectral sensitivity characteristic having a peak at a wavelength longer than the cut-on wavelength of the long-pass filter 60 is selected. Examples of the material of the photoelectric conversion layer 10 will be described below.

The counter electrode 12 is typically a transparent electrode made of a transparent conductive material. Examples of the material of the counter electrode 12 include transparent conducting oxides (TCOs) such as ITO, IZO, AZO, FTO, $SnO_2$, $TiO_2$, and $ZnO_2$. In the present specification, the term "transparent" means a property of transmitting at least a part of light in a wavelength range to be detected, and does not necessarily mean a property of transmitting light in the entire wavelength range of visible light.

As schematically illustrated in FIG. 1, the counter electrode 12 is connected to a voltage supply circuit 70. When the light sensor 100A is operating, a predetermined voltage is applied from the voltage supply circuit 70 to the counter electrode 12, and thus the pixel electrode 11 can selectively collect positive charges or negative charges that are generated in the photoelectric conversion layer 10. For example, by applying a voltage of about 10 V from the voltage supply circuit 70 to the counter electrode 12, the pixel electrode 11 can selectively collect positive charges from among positive and negative charges generated in the photoelectric conversion layer 10. In this example, the counter electrode 12 is formed across the plurality of pixels Px, and therefore it is possible to apply a voltage of a desired level to the counter electrodes 12 of the plurality of pixels Px.

The pixel electrode 11 is made of Al, Cu, Ti, TIN, Ta, TaN, Mo, Ru, Pt, or the like. The pixel electrode 11 is provided for each pixel Px, whereas the counter electrode 12 and the photoelectric conversion layer 10 are typically each formed across the plurality of pixels Px. The pixel electrode 11 of each pixel Px is electrically separated from the pixel electrode 11 of an adjacent pixel Px by being spatially separated from the pixel electrode 11 of the adjacent pixel Px.

The charges collected by the pixel electrode 11 are supplied to a detection circuit on the semiconductor substrate 30 via the conductive structure 52 made of a metal such as copper, and are read out by the detection circuit at a predetermined timing. In the configuration illustrated in FIG. 1, the detection circuit formed on the semiconductor substrate 30 includes the signal detection transistor 32, an address transistor 34, and a reset transistor 36. The semiconductor substrate 30 is not limited to a substrate the entirety of which is a semiconductor, and may be an insulating substrate or the like such that a semiconductor layer is provided on a surface thereof on a side on which the photoelectric converter 10L is disposed. The semiconductor substrate 30 may be, for example, a P-type silicon substrate.

The semiconductor substrate 30 includes impurity regions 32s, 32d, 34s, 36d, and 36s and element separation regions 31 for electrical separation between the pixels Px. The distance between two adjacent pixels Px, that is, the pixel pitch may be, for example, about 2 μm.

The impurity regions 32s, 32d, 34s, 36d, and 36s are each typically an N-type diffusion layer formed in the semiconductor substrate 30. The impurity regions 32s and 32d respectively function as, for example, a source region and a drain region of the signal detection transistor 32. In this example, the signal detection transistor 32 and the address transistor 34 are electrically connected to each other by sharing the impurity region 32s. The impurity region 32s also has a function as a drain region of the address transistor 34. The impurity region 34s functions as a source region of the address transistor 34, and is connected to a vertical signal line (not shown).

The impurity region 36s functions as, for example, a source region of the reset transistor 36, and the impurity region 36d functions as, for example, a drain region of the reset transistor 36. Among the impurity region 36s and the impurity region 36d, the impurity region 36d is electrically connected to the pixel electrode 11 via the conductive structure 52, and also has a function as a charge accumulation region that temporarily holds the charges collected by the pixel electrode 11. As schematically illustrated in FIG. 1, the conductive structure 52 is connected also to a gate electrode 32g of the signal detection transistor 32.

The insulation layer 50 on the semiconductor substrate 30 covers the signal detection transistor 32, the address transistor 34, and the reset transistor 36. The insulation layer 50 is typically a silicon dioxide layer. In the insulation layer 50, a wiring layer including the conductive structure 52 is disposed. The insulation layer 50 may include a plurality of inter-layer insulation layers. The number of layers in the insulation layer 50 may be set to any appropriate number.

With an embodiment of the present disclosure, the photoelectric converter is disposed above the semiconductor substrate, typically, on the insulation layer that covers the semiconductor substrate. Thus, in contrast to existing CMOS image sensors, a material that is different from a semiconductor included in the semiconductor substrate, such as silicon, can be selected as the material of photoelectric conversion layer. Therefore, it is possible to perform imaging about a desirable wavelength range irrespective of the absorption characteristic of the material of the semiconductor substrate that supports the photoelectric converter. Moreover, it is possible to form such a photoelectric conversion layer by using a comparatively simple method such vapor deposition or application.

(Exemplary Circuit Configuration of Light Sensor 100A)

Figure 2:
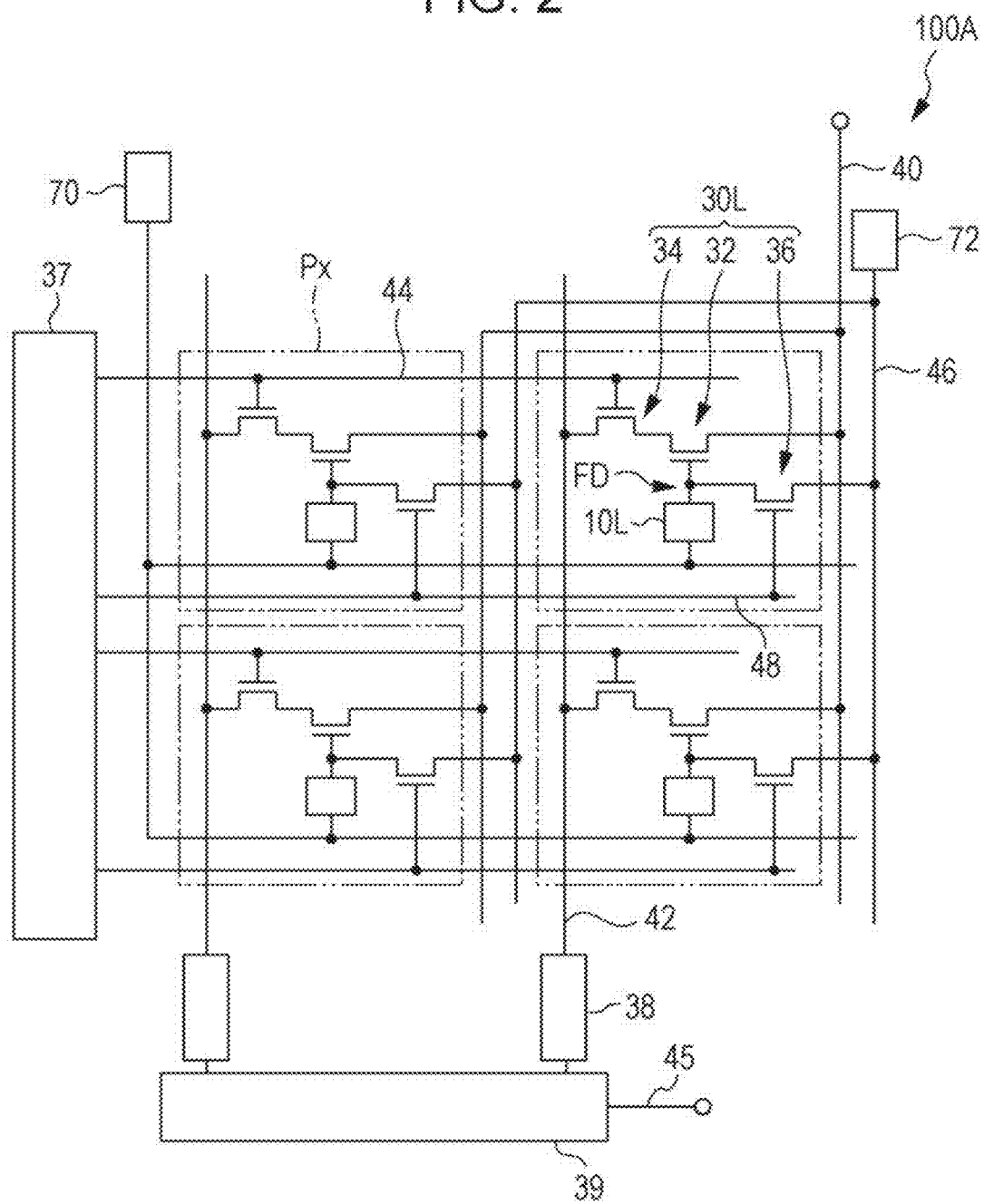
FIG. 2 is a schematic view illustrating an exemplary circuit configuration of the light sensor illustrated in FIG. 1.

FIG. 2 is a schematic view illustrating an exemplary circuit configuration of the light sensor 100A. The light sensor 100A includes, for example, a two-dimensional array of the pixels Px. To avoid excessive complexity of the figure, FIG. 2 illustrates four pixels Px extracted from the two-dimensional array of the pixels Px. The four pixels Px are arranged in 2 columns and 2 rows.

Each pixel Px includes the photoelectric converter 10L that receives incident light and generates a signal charge, and a detection circuit 30L that is connected to the photoelectric converter 10L and that detects a signal charge generated by the photoelectric converter 10L. The detection circuit 30L includes the signal detection transistor 32, the address transistor 34, and the reset transistor 36. The signal detection transistor 32, the address transistor 34, and the reset transistor 36 are typically field effect transistors (FETs). The address transistors may be, for example, N-channel MOSFETs.

As described above with reference to FIG. 1, the voltage supply circuit 70 is connected to the photoelectric converter 10L of each pixel Px. When the light sensor 100A is operating, the voltage supply circuit 70 supplies a predetermined voltage to, for example, the counter electrode 12 of the photoelectric converter 10L. The voltage supply circuit 70 is not limited to a specific power source circuit, and may be a circuit that generates a predetermined voltage or a circuit that changes a voltage supplied from another power source to a predetermined voltage. The voltage supply circuit 70 may be configured to be capable of switching voltage between two or more levels and supplying the voltage to the photoelectric converter 10L. For example, by switching voltage supplied from the voltage supply circuit 70 to the photoelectric converter 10L between a plurality of different voltages, it is possible to control starting and finishing of accumulation of signal charges from the photoelectric converter 10L to the charge accumulation region.

As illustrated in FIG. 2, the gate of the signal detection transistor 32 is connected to the photoelectric converter 10L. Signal charges generated by the photoelectric converter 10L are temporarily held by a floating diffusion node FD between the gate of the signal detection transistor 32 and the photoelectric converter 10L. A voltage according to the amount of held charges is read out via the address transistor 34 at a predetermined timing. A typical example of the signal charge is a positive hole, and an electron may be also used as the signal charge.

As illustrated in the figure, each pixel Px is connected to a power source line 40 that supplies a power source voltage VDD. The drain of the signal detection transistor 32 is connected to the power source line 40. A power source connected to the power source line 40 functions as a source-follower power source. The source of the signal detection transistor 32 is connected, via the address transistor 34, to one of a plurality of vertical signal lines 42 that are respectively provided for the rows of the pixels Px. The drain of the address transistor 34 is connected to the source of the signal detection transistor 32, and the source is connected to the vertical signal line 42.

The gate of the address transistor 34 is connected to an address control line 44. The address control line 44 is connected to a vertical scanning circuit 37, and the vertical scanning circuit 37 can select a plurality of pixels Px in each column by applying a predetermined voltage to the address control line 44 disposed in the column.

The vertical signal line 42 is a main signal line that transmits a pixel signal from an array of the pixels Px to a peripheral circuit. A column signal processing circuit 38 is connected to each of the vertical signal lines 42. A horizontal signal read-out circuit 39 is connected to the column signal processing circuits 38. The column signal processing circuit 38 performs noise-reduction signal processing, such as correlated double sampling, and analog-digital conversion. The horizontal signal read-out circuit 39 successively reads out signals from the column signal processing circuit 38 to a horizontal common signal line 45.

In the configuration illustrated in FIG. 2, the detection circuit 30L of each pixel Px includes the reset transistor 36. The reset transistor 36 is connected between a reset voltage line 46 that supplies a reset voltage Vr to each pixel Px and a floating diffusion node FD. The gate of the reset transistor 36 is connected to a reset control line 48. In this example, the reset control line 48 is connected to the vertical scanning circuit 37. The vertical scanning circuit 37 can reset a plurality of pixels Px in each column by applying a predetermined voltage to the reset control line 48 disposed in the column. That is, the vertical scanning circuit 37 can reset the voltage of the floating diffusion node FD to a reset voltage Vr by controlling the potential of the reset control line 48.

In this example, the reset voltage line 46 that supplies the reset voltage Vr to the reset transistor 36 is connected to a reset-voltage supply circuit 72. As with the voltage supply circuit 70 described above, the reset-voltage supply circuit 72 is not limited to a specific power source circuit, as long as the reset-voltage supply circuit 72 is configured to be capable of supplying a predetermined reset voltage Vr to the reset voltage line 46 during an operation. The voltage supply circuit 70 and the reset-voltage supply circuit 72 each may be a part of a single voltage supply circuit, or may be different voltage supply circuits that are independent from each other. One or both of the voltage supply circuit 70 and the reset-voltage supply circuit 72 may be a part/parts of the vertical scanning circuit 37. Alternatively, a voltage from the voltage supply circuit 70 and/or the reset voltage Vr from the reset-voltage supply circuit 72 may be supplied to each pixel Px via the vertical scanning circuit 37.

The power source voltage VDD of the detection circuit 30L may be used as the reset voltage Vr. In this case, a voltage supply circuit that supplies a power source voltage to each pixel Px (not shown in FIG. 2) and the reset-voltage supply circuit 72 can be integrated into one circuit. It is possible to simplify wiring in the array of the pixels Px, because the power source line 40 and the reset voltage line 46 can be integrated. However, using different voltages as the reset voltage Vr and the power source voltage VDD of the detection circuit 30L enables more flexible control of the light sensor 100A.

Figure 3:
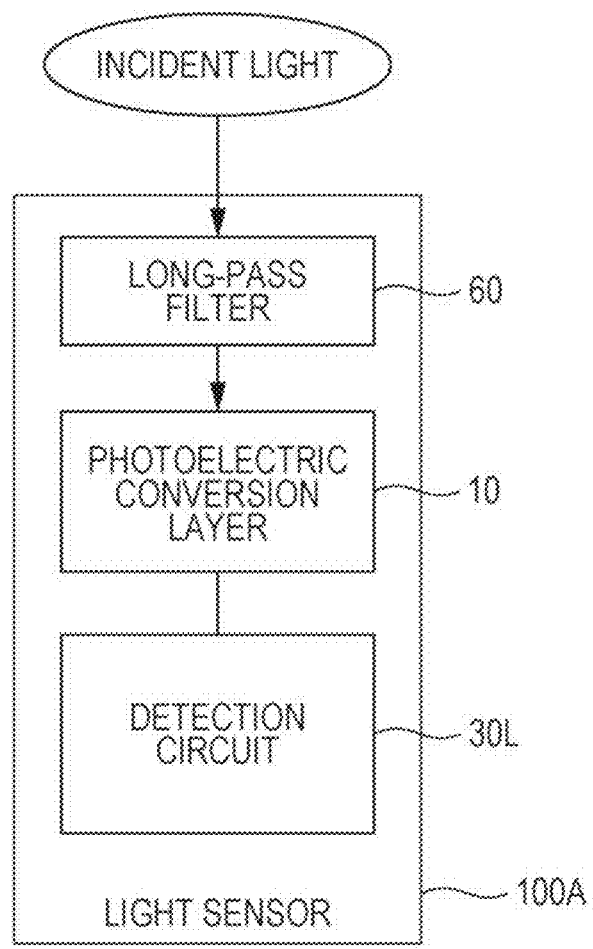
FIG. 3 is a schematic block diagram of the light sensor illustrated in FIG. 1.
Figure 4:
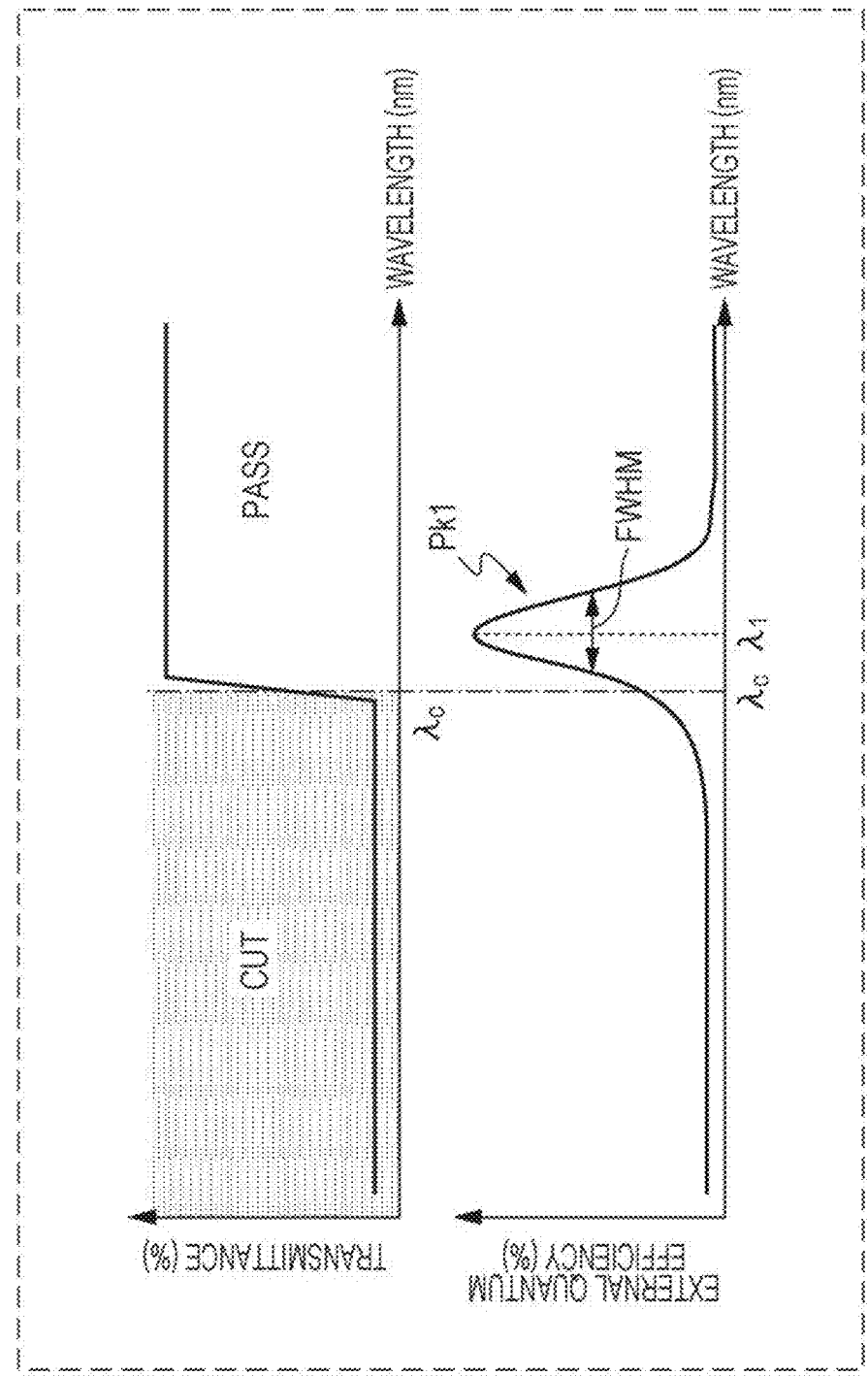
FIG. 4 illustrates an exemplary transmission spectrum of a long-pass filter and an exemplary spectral sensitivity curve about a main photoelectric conversion material included in a photoelectric conversion layer.

FIG. 3 is a block diagram schematically illustrating the configuration of the light sensor 100A. FIG. 4 illustrates an exemplary transmission spectrum of the long-pass filter 60 and an exemplary spectral sensitivity curve about a main photoelectric conversion material included in the photoelectric conversion layer 10.

The upper graph of FIG. 4 illustrates a typical example of the transmission spectrum of the long-pass filter 60. As can be seen from FIG. 4, the long-pass filter 60 has a function of blocking light having a wavelength less than a cut-on wavelength λc. The cut-on wavelength λc in FIG. 4 indicates a wavelength at which the transmittance of the long-pass filter 60 is 50% of the peak transmittance that is the maximum value of transmittance.

The lower graph of FIG. 4 illustrates an example of a spectral sensitivity curve about a photoelectric conversion material in the photoelectric conversion layer 10. In an embodiment of the present disclosure, among the materials of the photoelectric conversion layer 10, a photoelectric conversion material that mainly contributes to generation of a charge pair has a spectral sensitivity characteristic having a first peak Pk1 at a first wavelength 21 as illustrated in FIG. 4. As described below, the spectral sensitivity curve of the photoelectric conversion layer 10 may have a plurality of peaks. A peak of a spectral sensitivity curve, that is, a peak of sensitivity is synonymous with an absorption peak that is a maximal value of an absorption spectrum. The first peak Pk1, which is one of peaks of the spectral sensitivity curve, is identified as a peak of sensitivity that exists at the first wavelength λ1 that is longer than the cut-on wavelength λc of the long-pass filter 60 as illustrated in the figure.

The first peak Pk1 is comparatively sharp, and the full width at half maximum (FWHM) of the first peak Pk1 is typically less than or equal to 200 nm. As can be seen from FIG. 4, in an embodiment of the present disclosure, the spectral sensitivity of the photoelectric conversion layer 10 at the cut-on wavelength λc of the long-pass filter 60 is in the range of greater than or equal to 0% and less than or equal to 50% of the spectral sensitivity of the photoelectric conversion layer 10 at the first wavelength λ1. A typical example of a material having such a spectral sensitivity characteristic is a material that exhibits a quantum confinement effect, such as a carbon nanotube or a quantum dot.

When a material that can exhibit a quantum confinement effect is used as the photoelectric conversion material of the photoelectric conversion layer 10, the spectral sensitivity of the photoelectric conversion layer 10 has a low value that is about 50% or less of the peak value at the first wavelength 21, except for the peak and the vicinity thereof. Ideally, the photoelectric conversion layer 10 has almost no sensitivity to any wavelength except for wavelengths at the peak of the spectral sensitivity curve and in the vicinity thereof. The first peak Pk1 is, for example, an absorption peak that corresponds to E11 transition of a carbon nanotube. Also when a quantum dot is used as the photoelectric conversion material of the photoelectric conversion layer 10, a similar spectral sensitivity characteristic can be obtained because the density of states of a quantum dot is discrete.

When a material that can exhibit a quantum confinement effect is used as the photoelectric conversion material of the photoelectric conversion layer 10, it is particularly easy to obtain a comparatively low spectral sensitivity that is less than or equal to about 50%, in particular, at wavelengths longer than the first wavelength 21 at which the first peak Pk1 exists. That is, by using a material that can exhibit a quantum confinement effect as the photoelectric conversion material of the photoelectric conversion layer 10, an advantage is obtained in that a filter for cutting light having a wavelength longer than the first wavelength λ1 is not necessary. When focused on wavelengths shorter than the first wavelength λ1, due to a second optical transition or an effect of absorption by an acceptor in the photoelectric conversion layer, it may occur that spectral sensitivity does not decrease as much as that at wavelengths longer than the first wavelength λ1. However, at wavelengths shorter than the first wavelength λ1, it is possible to form a region having a comparatively low spectral sensitivity, that is, a spectral sensitivity lower than that at the first peak Pk1.

When a quantum dot is used as the photoelectric conversion material of the photoelectric conversion layer 10, the ratio between the peak value of the spectral sensitivity of the photoelectric conversion layer 10 and the value of spectral sensitivity of the photoelectric conversion layer 10 in a region excluding the peak and the vicinity thereof (sensitivity ratio) may change in accordance with variation in particle diameter of quantum dots. Details of a material that can exhibit a quantum confinement effect will be described below.

Figure 5:
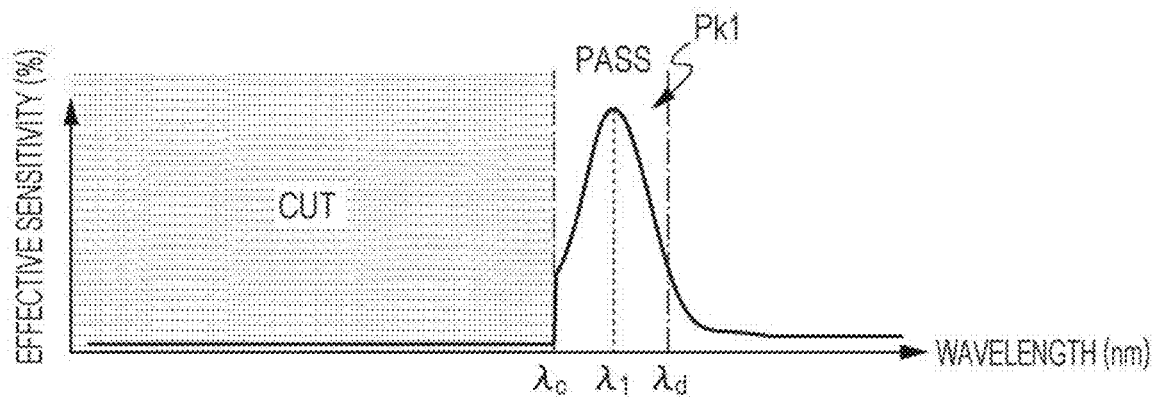
FIG. 5 is a graph illustrating the spectral sensitivity characteristic of the light sensor illustrated in FIG. 1.

FIG. 5 illustrates the spectral sensitivity characteristic of the light sensor 100A. As described above, in the light sensor 100A, the long-pass filter 60 is positioned in front of the photoelectric conversion layer 10. Therefore, light having a wavelength less than the cut-on wavelength λc of the long-pass filter 60 is substantially not incident on the photoelectric conversion layer 10; and the photoelectric conversion layer 10 receives a component of light that is incident on the light sensor 100A, the component having passed through the long-pass filter 60. As a result, the effective sensitivity of the light sensor 100A is a composite of a transmission spectrum about the long-pass filter 60 and an absorption spectrum about the photoelectric conversion layer 10. That is, the light sensor 100A effectively has no sensitivity to light having a wavelength less than the cut-on wavelength λc of the long-pass filter 60.

When focused on wavelengths longer than the first wavelength λ1, because the photoelectric conversion layer 10 does not have high sensitivity except for wavelengths at the peak and in the vicinity thereof, the light sensor 100A effectively has no sensitivity to light having a certain wavelength λd longer than the first wavelength λ1. The wavelength λd is determined by the spectral sensitivity characteristic of a main photoelectric conversion material included in the photoelectric conversion layer 10.

That is, as illustrated in FIG. 5, the light sensor 100A selectively has sensitivity to a specific wavelength range from λc to λd including the first wavelength λ1. Thus, with an embodiment of the present disclosure, because a main photoelectric conversion material that mainly contributes to generation of a charge used as a signal charge has a sharp absorption peak, it is possible to perform narrow-band imaging by using a combination with a long-pass filter that is configured more simply than a band-pass filter. Accordingly, it is possible to provide, at low cost, a light sensor that can perform narrow-band imaging.

As the long-pass filter 60, a known absorptive or interference optical filter may be used. In particular, by using an absorptive optical filter as the long-pass filter 60, the long-pass filter 60 can have an intended filter function even for oblique light. Moreover, an absorptive optical filter is more advantageous than an interference optical filter in terms of manufacturing cost. In the present specification, the term "filter" refers to an element that can block or transmit light in a specific wavelength range. Members that are disposed in front of an imaging region and that secondarily have slight wavelength selectivity, such as a cover glass and a lens, are not included in "filter" in the present specification.

As illustrated in FIG. 4, the cut-on wavelength λc of the long-pass filter 60 may overlap an increasing part, from a rising part to the peak value at the first peak Pk1, of the spectral sensitivity curve about the material of the photoelectric conversion layer 10. In this case, it is possible to sufficiently reduce the effective sensitivity at wavelengths shorter than the cut-on wavelength λc, because the step in the transmission spectrum of the long-pass filter 60 overlaps the rising part of the spectral sensitivity curve about the material of the photoelectric conversion layer 10. Thus, a certain level of margin is allowed in designing the cut-on wavelength λc.

A band-pass filter may be used in addition to the long-pass filter 60. For example, a band-pass filter that transmits light in the wavelength range from λc to λd may be disposed in front of the long-pass filter 60. Thus, sensitivity at wavelengths outside of the wavelength range from λc to λd can be further reduced. The band-pass filter may be disposed between the long-pass filter 60 and the photoelectric conversion layer 10. The transmitting wavelength range of the band-pass filter may be broader than the wavelength range from λc to λd, or may be narrower than the wavelength range from λc to λd.

As heretofore described, in an embodiment of the present disclosure, the wavelength λc, which is the lower limit of the wavelength range in which the light sensor effectively has sensitivity is defined by filtering by a long-pass filter; and the wavelength λd, which is the upper limit of the wavelength range, is defined by using the sharply-falling cut-off characteristic of the photoelectric conversion material. In an embodiment of the present disclosure, an element that contributes to photoelectric conversion is not made of a solid crystal but is made of a material having a quantum confinement effect such as a carbon nanotube or a quantum dot, and thus change in the wavelength λd due to change in temperature is small. Accordingly, it is possible to reduce the temperature dependency of a target wavelength range in narrow-band imaging. That is, it is possible to provide a light sensor that is robust against change in ambient temperature and change in temperature of the camera system. When focused on wavelengths shorter than wavelength λc, because sensitivity is restricted due to the absorption characteristics of the photoelectric conversion material, it is possible to restrict the effective sensitivity to a low level also due to the light-blocking ability of the long-pass filter, and it is possible to perform imaging with high precision with respect to light in a desirable wavelength range including the first wavelength λ1.

(Typical Example of Material of Photoelectric Conversion Layer 10)

Next, a typical example of the material of the photoelectric conversion layer 10 will be described in detail. As the photoelectric conversion material of the photoelectric conversion layer 10, a carbon nanotube or a material having a quantum nanostructure having a quantum confinement effect can be used.

A carbon nanotube has a structure such that graphene is rolled up and has a substantially cylindrical seamless shape having a diameter in a nanometer region. A structure having a single cylinder structure is called a single-wall carbon nanotube, and a structure in which multiple cylinders are nested is called a multi-wall carbon nanotube. Many of the electronic characteristics and the optical characteristics of a single-wall carbon nanotube is determined by chirality specified by a chiral index, and the single-wall carbon nanotube has a metallic property or a semiconducting property in accordance with the chirality.

The energy of electrons in a single-wall carbon nanotube is specified only by wave number in the axial direction of the tube due to periodicity derived from the cylindrical shape of the tube. That is, the electronic state of a single-wall carbon nanotube is one-dimensional. The band structure of a single-wall carbon nanotube has a feature in that subbands, each of which is an energy level at which the density of states diverges, exist discretely. Such a singularity in the density of states is called a Van Hove singularity.

The absorption spectrum of a single-wall carbon nanotube has a sharp peak at a wavelength corresponding to an energy between the subbands. Among optical transitions that are allowed by the optical transition selection rule, an optical transition with the lowest energy will be referred to as "first optical transition", and an optical transition with the second lowest energy will be referred to as "second optical transition". For a carbon nanotube, an optical transition between the first subbands counted from the Fermi level is the first optical transition, and an optical transition between the second subbands counted from the Fermi level is the second optical transition.

Thus, a single-wall carbon nanotube has a degree of freedom called "chirality", and, as shown below in Table 1, exhibits resonance absorption at wavelengths that differ in accordance with chirality. For example, a semiconductive carbon nanotube having a chiral index of (9, 8) exhibits resonance absorption at wavelengths around 800 nanometers and around 1.41 micrometers. A semiconductive carbon nanotube having a chiral index of (7, 6) exhibits resonance absorption at wavelengths around 650 nanometers and around 1.13 micrometers. Accordingly, for example, by forming the photoelectric conversion layer 10 from a single-wall carbon nanotube having a chirality corresponding to the wavelength of light to be detected, it is possible to form a pixel that specifically has high sensitivity at a specific wavelength. The value of each wavelength shown in Table 1 is only an example, and the value may have an error of about 50 nanometers relative to an actually measured value.

TABLE 1

| Chirality | (7, 6) | (8, 7) | (9, 8) |
|---|---|---|---|
| Wavelength corresponding to First Optical Transition (corresponding to E11 transition) | 1130 nm | 1280 nm | 1410 nm |
| Wavelength corresponding to Second Optical Transition (corresponding to E22 transition) | 650 nm | 730 nm | 800 nm |

As the photoelectric conversion material of the photoelectric conversion layer 10, a quantum nanostructure having a quantum confinement effect may be used. The term "quantum nanostructure" refers to a structure that exhibits a quantum size effect one-dimensionally, two-dimensionally, or three-dimensionally. Examples of the material of the quantum nanostructure include: group V semiconductors such as Si and Ge; group IV-VI semiconductors such as PbS, PbSe, and PbTe; group III-V semiconductors such as InAs and InSb; and three-element mixed crystals such as HgCdTe and PbSnTe.

An example of a quantum nanostructure that exhibits a one-dimensional quantum confinement effect is a nanorod, a nanowire, or a carbon nanotube having a diameter smaller than or equal to several tens of nanometers and a length greater than or equal to several hundreds of nanometers. The diameter of a nanorod and a nanowire differs depending on the used material. For example, the diameter is about 18 nanometers if the material is PbS, about 29 nanometers if the material is InAs, and about 61 nanometers if the material is InSb. The length of a nanorod and a nanowire has a value that is large compared with the Bohr radius of the used material.

An example of a quantum nanostructure that exhibits a two-dimensional quantum confinement effect is a crystal having a quantum well or a superlattice. The thickness of a layer of a crystal having a quantum well and the thickness of a superlattice is less than equal to half the Bohr radius of the used material. An example of a quantum nanostructure that exhibits a three-dimensional quantum confinement effect is a quantum dot. A quantum dot is a nanocrystal having a diameter of about 2 to 10 nanometers and is composed of about several tens of atoms. The surface of a quantum dot may be modified with a dispersant or a ligand. The quantum dot may have a perovskite structure represented by a chemical formula $APbX_3$. In the chemical formula $APbX_3$, A is an element selected from the group consisting of cesium, methylammonium, and formamidinium; and X is chlorine, bromine, or iodine.

Figure 6:
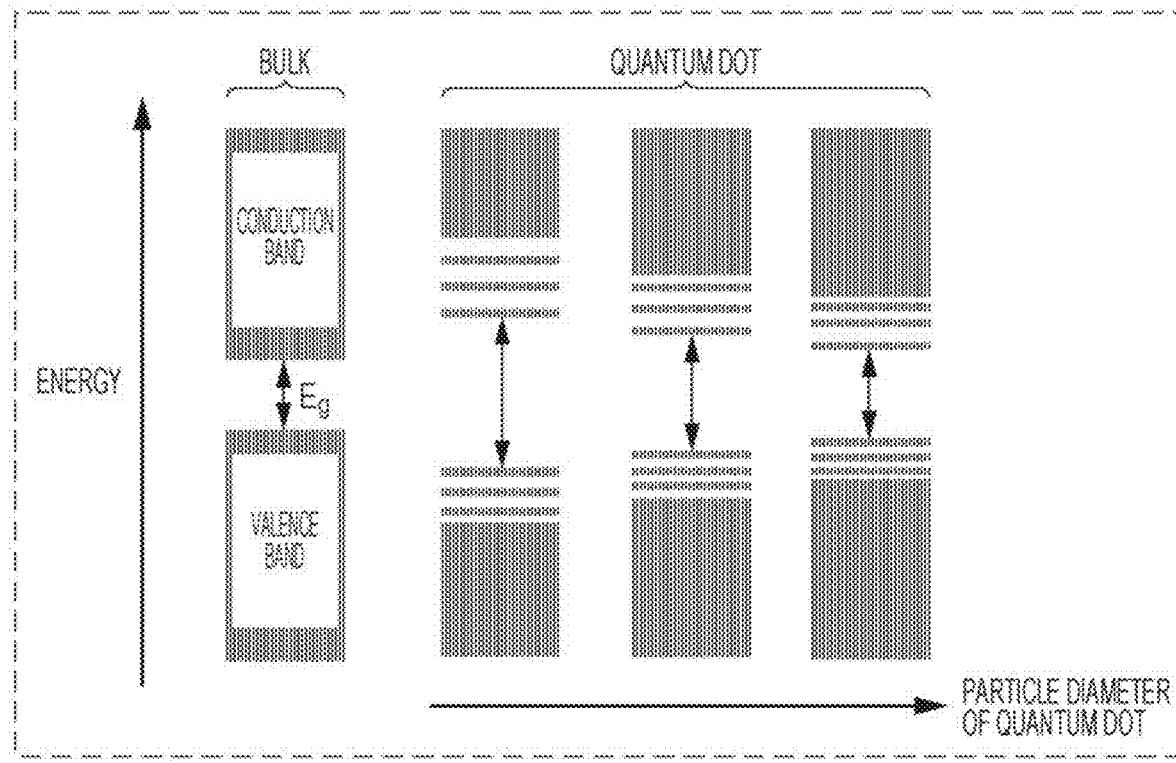
FIG. 6 illustrates an example of an energy band about a material in the form of bulk and an example of an energy band about a material in the form of quantum dots.

When the particle diameter becomes less than or equal to about the Bohr radius, excitons and electrons are three-dimensionally confined in a space, and the density of states thereof becomes discrete in contrast to that when the material is in the form of bulk. Moreover, as schematically illustrated in FIG. 6, as the particle diameter decreases, the quantum confinement effect increases and the gap expands. Accordingly, even when the material is the same, by using the material in the form of quantum dots, it is possible to form an energy gap larger than an energy gap when the material is in the form of bulk, and it is possible to adjust the size of the gap by changing the particle diameter.

In contrast to a carbon nanotube, with a quantum dot, the width of an absorption peak based on the first optical transition may considerably vary depending on the material and the particle diameter thereof. Accordingly, when, for example, a quantum dot is selected as the photoelectric conversion material of the photoelectric conversion layer 10, it is possible to adjust a wavelength at which the photoelectric conversion layer 10 specifically has absorptance by adjusting the material and the particle diameter thereof.

The photoelectric conversion layer 10 may have an absorption peak other than the first peak Pk1. That is, the photoelectric conversion layer 10 may have a spectral sensitivity characteristic having a plurality of peaks including the first peak Pk1.

Figure 7:
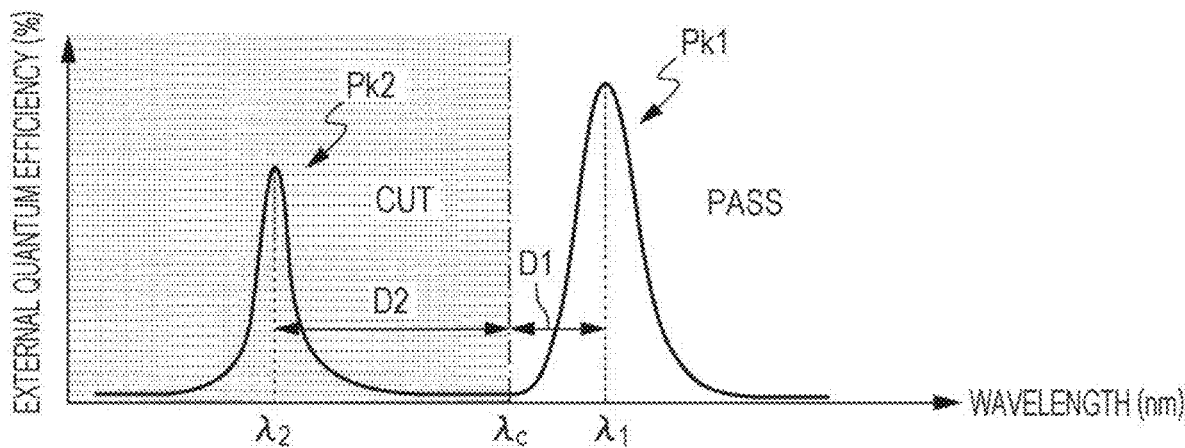
FIG. 7 illustrates another example of a spectral sensitivity curve about the photoelectric conversion layer.

FIG. 7 illustrates another example of a spectral sensitivity curve about the photoelectric conversion layer 10. In this example, the spectral sensitivity curve has a second peak Pk2 at a second wavelength $\lambda 2$, in addition to the first peak Pk1 positioned at the first wavelength $\lambda 1$. The second peak Pk2 is one of a plurality of absorption peaks of the spectral sensitivity curve. The second wavelength $\lambda 2$ is, for example, a wavelength corresponding to the second optical transition. In this case, the first peak Pk1 corresponds to the first optical transition of the material of the photoelectric conversion layer 10, and is a peak that is positioned at the longest wavelength among the plurality of peaks. In other words, the second peak Pk2 is an absorption peak that is positioned at the second longest wavelength among the plurality of peaks.

As schematically illustrated in FIG. 7, in an embodiment of the present disclosure, the material of the photoelectric conversion layer 10 and the optical characteristics of the long-pass filter 60 are determined so that the second peak Pk2 is positioned in a range less than the cut-on wavelength $\lambda c$. Therefore, the light sensor 100A effectively has no sensitivity to the second wavelength $\lambda 2$ corresponding to the second peak Pk2. Even when the material of the photoelectric conversion layer 10 has a plurality of absorption peaks as in this case, by positioning the peaks at wavelengths less than the cut-on wavelength $\lambda c$, it is possible to effectively eliminate sensitivity to the wavelengths corresponding to the plurality of absorption peaks and to prevent the light sensor from having sensitivity at the wavelengths. That is, it is possible to provide a light sensor that specifically has sensitivity at the first wavelength $\lambda 1$ corresponding to the first peak Pk1.

Figure 8:
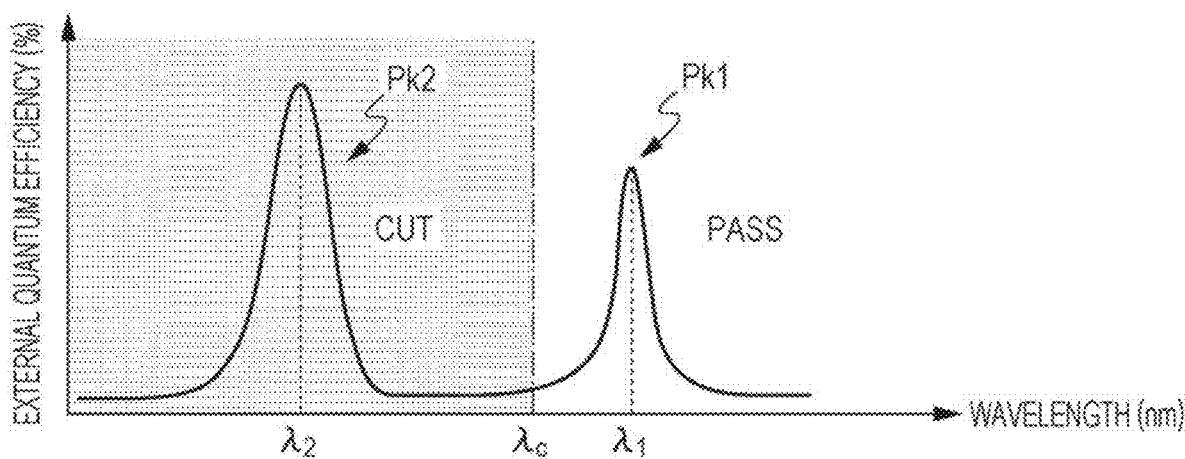
FIG. 8 illustrates still another example of a spectral sensitivity curve about the photoelectric conversion layer.

Because the density of states of a carbon nanotube and a quantum dot is discrete, a peak of the spectral sensitivity curve of a photoelectric conversion layer made of these has a sharp shape, and a clear valley exists between two peaks. Two adjacent peaks are separated from each other by a wavelength corresponding to the difference between a wavelength corresponding to the magnitude of an energy gap of a certain optical transition (for example, E22 transition) and a wavelength corresponding to the magnitude of an energy gap of another optical transition (for example, E11 transition). Therefore, by positioning the cut-on wavelength $\lambda c$ of the long-pass filter 60 in a valley between the peaks, where sensitivity is relatively low, it is possible to substantially eliminate sensitivity due to absorption peaks other than the first peak Pk1. Moreover, because the photoelectric conversion layer 10 has almost no sensitivity at wavelengths between two adjacent peaks, the width of wavelengths that can be selected as the cut-on wavelength $\lambda c$ is large, and the degree of freedom in selection of an optical filter that can be used as the long-pass filter 60 is comparatively high. In particular, when the spectral sensitivity curve of the material of the photoelectric conversion layer 10 has the first peak Pk1 and the second peak Pk2, if the difference D1 between the first wavelength $\lambda 1$ and the cut-on wavelength $\lambda c$ is smaller than the difference D2 between the cut-on wavelength $\lambda c$ and the second wavelength 12, and an advantage is obtained in that it is easy to eliminate unnecessary sensitivity outside of a narrow target range. In the example illustrated in FIG. 7, the first peak Pk1 is higher than the second peak Pk2. However, as illustrated in FIG. 8, it is easily understood that the second peak Pk2 may be higher than the first peak Pk1 as long as the second wavelength $\lambda 2$ is less than the cut-on wavelength $\lambda c$.

By positioning the cut-on wavelength $\lambda c$ of the long-pass filter in a valley region between peaks of a spectral sensitivity curve about the photoelectric conversion layer, even if the cut-on wavelength $\lambda c$ varies due to change in ambient temperature, it is possible to reduce the effect that the change in temperature exerts on an image, because the spectral sensitivity of the photoelectric conversion layer around the cut-on wavelength $\lambda c$ is relatively low. That is, it is possible to provide a light sensor that is robust against change in ambient temperature.

As described above, materials such as a carbon nanotube and a quantum dot have characteristics having a specific absorption peak at a specific wavelength. Accordingly, a photoelectric conversion layer made of such a photoelectric conversion material has a spectral sensitivity characteristic having a sharp absorption peak, in contrast to a broad absorption characteristic of a device that is formed in a semiconductor crystal, such as an embedded photodiode. Accordingly, the photoelectric conversion layer is advantageous in narrow-band imaging.

When seen as a solid, the macroscopic periodicity of a photoelectric conversion material having a quantum confinement effect, such as a carbon nanotube or a quantum dot, is lower than that of a crystal, and thus a shift of absorption wavelength according to temperature is smaller than that of a crystalline solid. In fact, although a change of about 50 meV is observed between absolute zero and near-ambient temperature in a band gap for materials such as Si and InGaAs, the amount of change of energy gap in a carbon nanotube and a quantum dot is only about 15 meV. Therefore, by forming the photoelectric conversion layer 10 from such a material, it is possible to reduce the effect that the shift of absorption wavelength due to change in temperature exerts on the spectral sensitivity characteristic of the light sensor.

Figure 9:
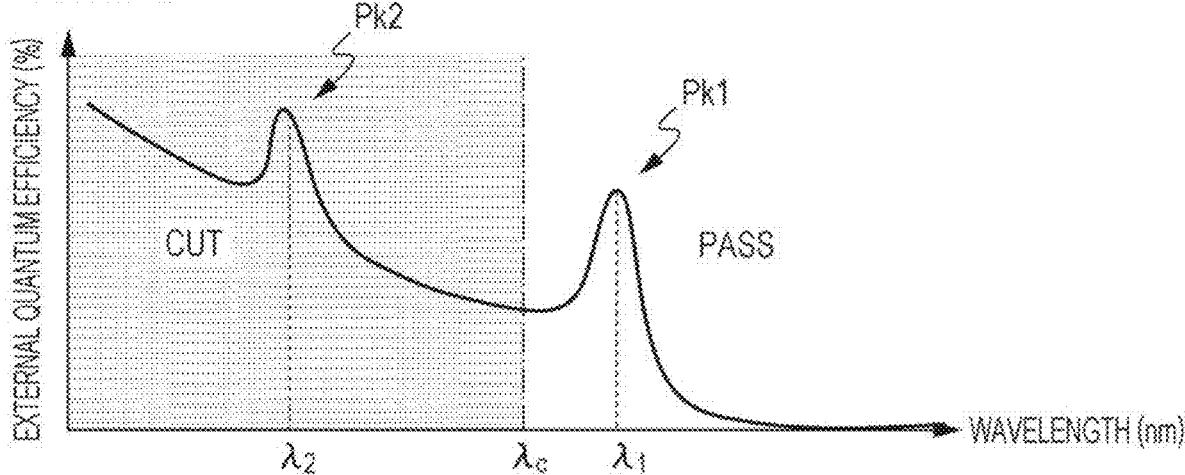
FIG. 9 illustrates still another example of a spectral sensitivity curve about a photoelectric conversion layer.

FIG. 9 illustrates still another example of a spectral sensitivity curve about the photoelectric conversion layer 10. In the example illustrated in FIG. 9, in a wavelength range shorter than the cut-on wavelength $\lambda c$ of the long-pass filter 60, the photoelectric conversion layer 10 has a certain level of sensitivity, for example, a sensitivity that is higher than 50% of the spectral sensitivity at the first wavelength $\lambda 1$. Even when the photoelectric conversion layer has such a spectral sensitivity characteristic, it is possible to make the effective sensitivity of the light sensor in the wavelength range less than the cut-on wavelength $\lambda c$ be substantially zero, because the long-pass filter 60 sufficiently attenuates a component of light that is incident on the light sensor, the component having a wavelength shorter than the cut-on wavelength $\lambda c$.

Figure 10:
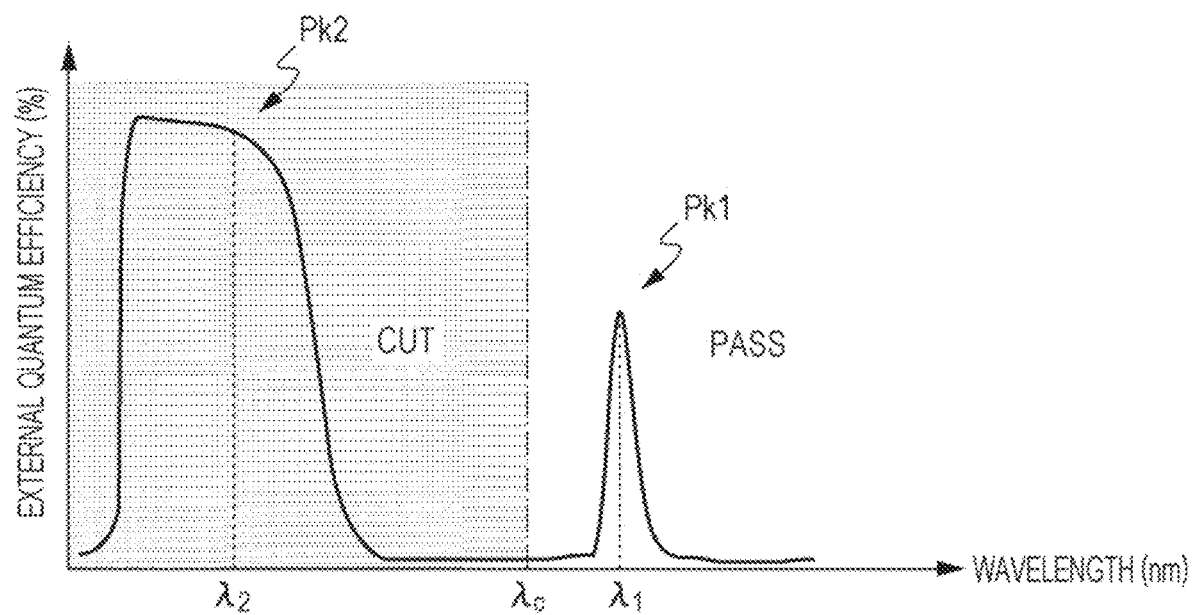
FIG. 10 illustrates still another example of a spectral sensitivity curve about the photoelectric conversion layer.

FIG. 10 illustrates still another example of a spectral sensitivity curve about the photoelectric conversion layer 10. As illustrated in FIG. 10, resonance corresponding to an optical transition with an energy higher than the first optical transition may exist as a broad peak at a relatively short wavelength in the spectral sensitivity curve. As the wavelength decreases further, the material of photoelectric conversion layer stops exhibiting absorptance, and thus sensitivity sharply decreases.

Also in the example illustrated in FIG. 10, the spectral sensitivity curve has a valley in a region between a falling part of the second peak Pk2 and a rising part of the first peak Pk1. Accordingly, by setting the cut-on wavelength λc of the long-pass filter 60 in the valley region, it is possible to effectively eliminate sensitivity due to a peak other than the first peak Pk1. The valley region has a comparatively wide range between the second peak Pk2 and the first peak Pk1, and thus it is possible to select the cut-on wavelength λc from the comparatively wide range.

An effect that occurs on the spectral sensitivity characteristic of the photoelectric conversion layer when the photoelectric conversion layer includes two types of quantum dots that are made of the same material and that have different particle diameter distributions will be concisely described. As described above, when a quantum dot is selected as the photoelectric conversion material, a wavelength at which the photoelectric conversion layer specifically has absorptance differs according to the particle diameter of the quantum dot. For example, the following case will be assumed: quantum dots having different average particle diameters are inevitably mixed during the process of manufacturing the photoelectric conversion layer, and thus the photoelectric conversion layer includes a quantum dot having an absorption characteristic shown by a curve S1 in FIG. 11 and a quantum dot having an absorption characteristic shown by a curve S2 in FIG. 11.

Figure 11:
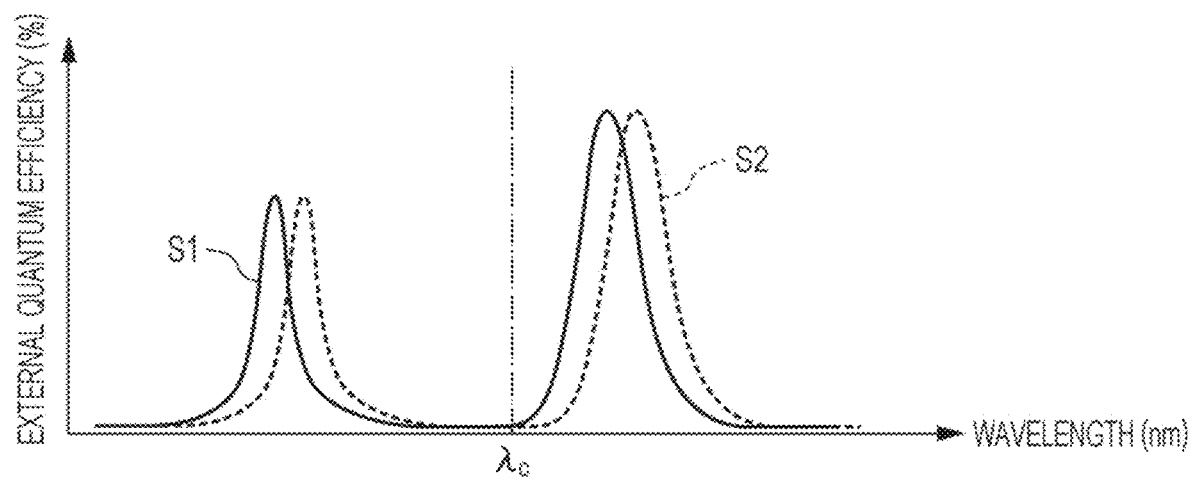
FIG. 11 is a graph illustrating absorption characteristics about two types of quantum dots having different particle diameter distributions.
Figure 12:
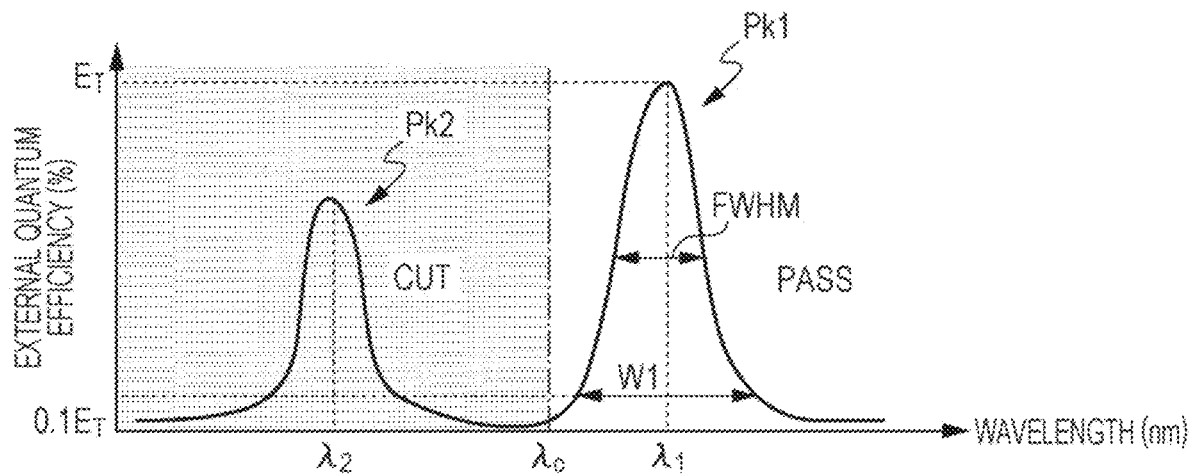
FIG. 12 illustrates an example of the spectral sensitivity curve of a photoelectric conversion layer that contains quantum dots having the absorption characteristics illustrated in FIG. 11.

FIG. 12 illustrates an example of the spectral sensitivity curve of a photoelectric conversion layer that contains quantum dots having the absorption characteristics illustrated in FIG. 11. As schematically illustrated in FIG. 12, in a case where the photoelectric conversion layer includes two types of quantum dots having different particle diameter distributions, the first peak Pk1 and the second peak Pk2 may become slightly broad, compared with a case where the photoelectric conversion layer is formed from one type of quantum dot. However, even in such a case, the spectral sensitivity curve still has a valley region between the second peak Pk2 and the first peak Pk1, and it is still possible to selectively extract sensitivity due to the first peak Pk1 by setting the cut-on wavelength λc in the valley region.

As with the examples described above, the full width at half maximum (FWHM) of the first peak Pk1 is, for example, less than or equal to 200 nm. In a spectral sensitivity curve about the photoelectric conversion layer 10, when the maximal value at the first wavelength λ1 is denoted by ET, it is more advantageous for narrow-band imaging if the width W1 of the first peak Pk1 at a position where spectral sensitivity is 10% of ET is less than or equal to 200 nm. In view of advantageously performing narrow-band imaging, as described above with reference to FIG. 4, the spectral sensitivity of the long-pass filter 60 at the cut-on wavelength λc is, for example, in the range of greater than or equal to 0% and less than or equal to 50% of the spectral sensitivity at the first wavelength λ1. The spectral sensitivity of the long-pass filter 60 at the cut-on wavelength λc may be greater than or equal to 0% and less than or equal to 30% of the spectral sensitivity at the first wavelength λ1, or may be greater than or equal to 0% and less than or equal to 10% of the spectral sensitivity at the first wavelength λ1.

Figure 13:
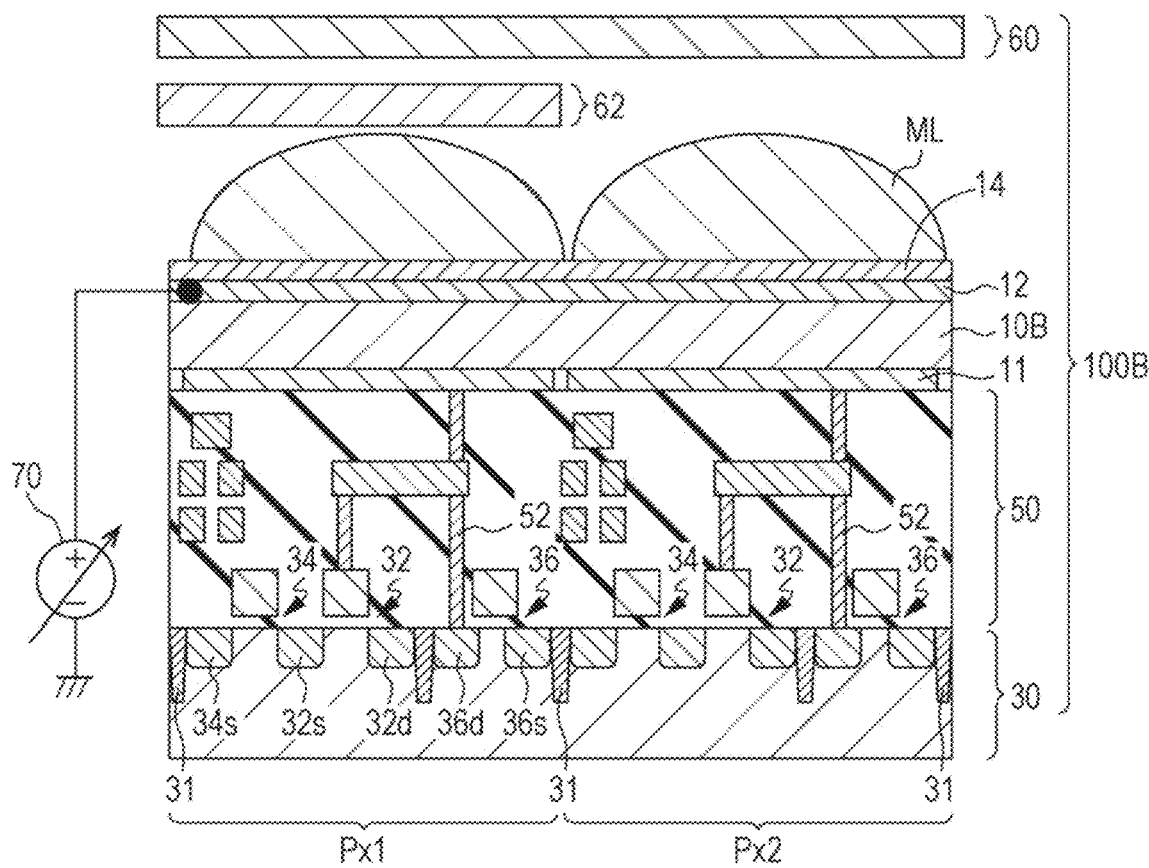
FIG. 13 is a schematic sectional view of a modification of a pixel of a light sensor according to an embodiment of the present disclosure.

FIG. 13 illustrates a modification of a light sensor according to an embodiment of the present disclosure. A light sensor 100B illustrated in FIG. 13 includes two or more pixels. Among these pixels, a first pixel Px1 and a second pixel Px2 that are disposed adjacent to each other are illustrated.

Compared with the example illustrated in FIG. 1, the light sensor 100B includes a photoelectric converter including a photoelectric conversion layer 10B, instead of the photoelectric conversion layer 10. As described below, the photoelectric conversion layer 10B contains, as main photoelectric conversion materials that contribute to generation of a charge used as a signal charge, two or more types of photoelectric conversion materials, such as two types of carbon nanotubes having different chiralities or two types of quantum dots made of different materials.

The light sensor 100B includes a short-pass filter 62 in addition to the long-pass filter 60. However, the short-pass filter 62 covers, among the photoelectric converters of the plurality of pixels, the photoelectric converters of some of the pixels. In this example, although the photoelectric converter of the pixel Px1 is covered by the short-pass filter 62, the short-pass filter 62 is not positioned directly above the photoelectric converter of the pixel Px2. In the configuration illustrated in FIG. 13, the short-pass filter 62 is positioned between the long-pass filter 60 and the photoelectric conversion layer 10B. However, the position of the short-pass filter 62 is not limited to this example, and the short-pass filter 62 may be disposed in front of the long-pass filter 60.

In the example illustrated in FIG. 13, a protective layer 14 is provided on the counter electrode 12 of the photoelectric conversion layer 10B, and the microlens ML is disposed on the protective layer 14. As in the example illustrated in FIG. 13, the microlens ML may be provided for each pixel or may be provided for a plurality of pixels. The microlens ML may be omitted.

Figure 14:
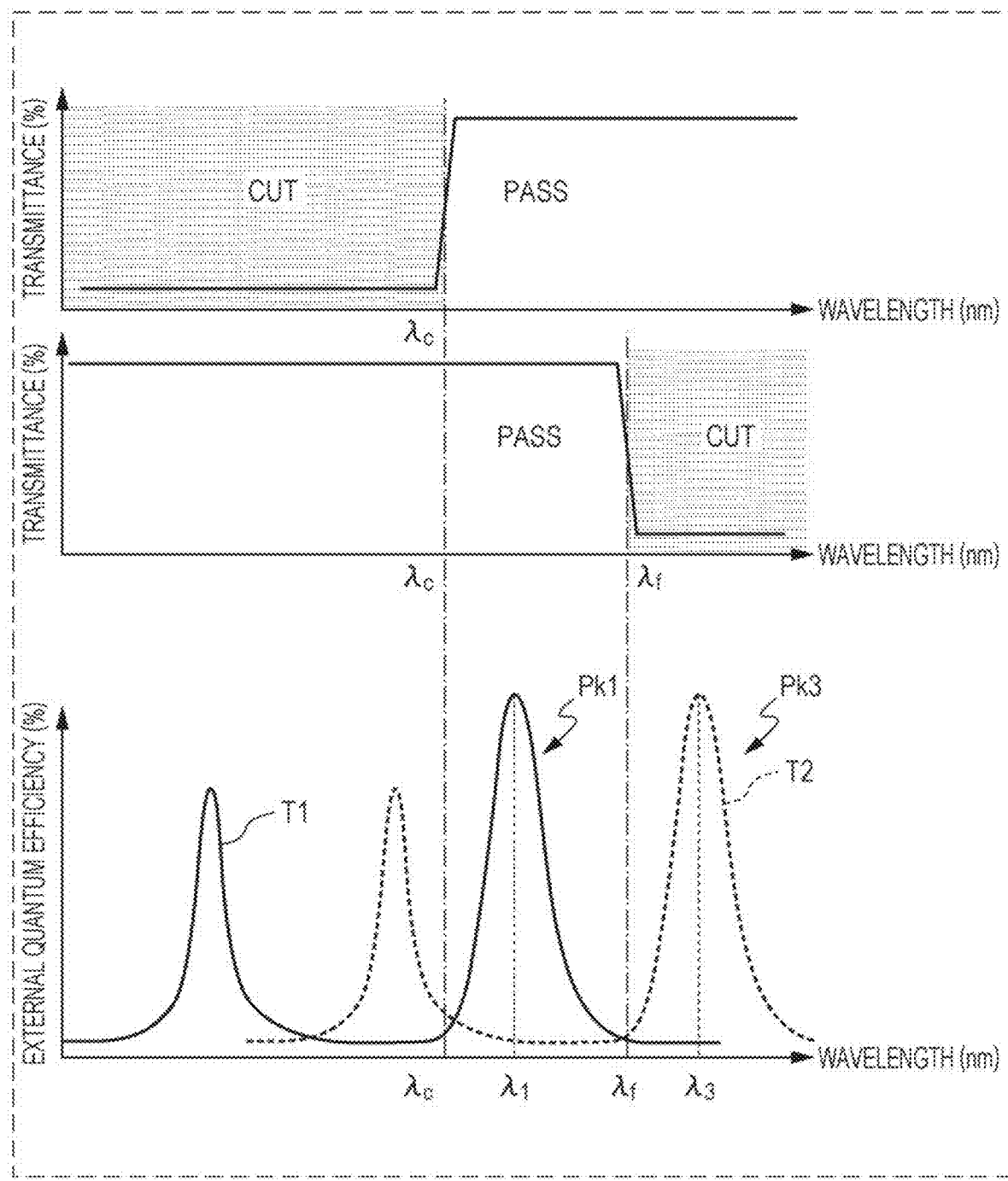
FIG. 14 illustrates an exemplary transmission spectrum of a long-pass filter, an exemplary transmission spectrum of a short-pass filter, and exemplary spectral sensitivity curves about main photoelectric conversion materials included in the photoelectric conversion layer.

FIG. 14 illustrates an exemplary transmission spectrum of the long-pass filter 60, an exemplary transmission spectrum of the short-pass filter 62, and exemplary spectral sensitivity curves about main photoelectric conversion materials included in the photoelectric conversion layer 10B. The first graph from the top of FIG. 14 illustrates an exemplary transmission spectrum of the long-pass filter 60, and the second graph from the top of FIG. 14 illustrates an exemplary transmission spectrum of the short-pass filter 62. As illustrated in the graphs, the short-pass filter 62 has a characteristic of selectively transmitting light having a wavelength less than a certain cut-off wavelength λf. The cut-off wavelength λf shown in FIG. 14 indicates a wavelength at which the transmittance of the short-pass filter 62 is 50% of a peak transmittance that is the maximum value of transmittance.

The third graph from the top of FIG. 14 illustrates an exemplary spectral sensitivity curve T1 about a first photoelectric conversion material and an exemplary spectral sensitivity curve T2 about a second photoelectric conversion material, among main photoelectric conversion materials included in the photoelectric conversion layer 10B. The first and second photoelectric conversion materials are, for example, a set of two types of carbon nanotubes that have different chiralities or a set of materials that have quantum nanostructures and that are made of different raw materials. As with examples described above, because materials that exhibit a quantum confinement effect are used as the photoelectric conversion materials, the first and second photoelectric conversion materials have spectral sensitivity characteristic having sharp absorption peaks.

In this example, in particular, the spectral sensitivity curve T1 about the first photoelectric conversion material has the first peak Pk1 positioned at the first wavelength λ1. As illustrated in the figures, the first wavelength λ1 is longer than the cut-on wavelength λc of the long-pass filter 60 and is shorter than the cut-off wavelength λf of the short-pass filter 62. The peak of absorption of the second photoelectric conversion material is positioned outside of a range of greater than or equal to λc and less than or equal to λf. The second photoelectric conversion material has a third peak Pk3 positioned at a third wavelength λ3 that is longer than the cut-off wavelength λf of the short-pass filter 62.

Figure 15:
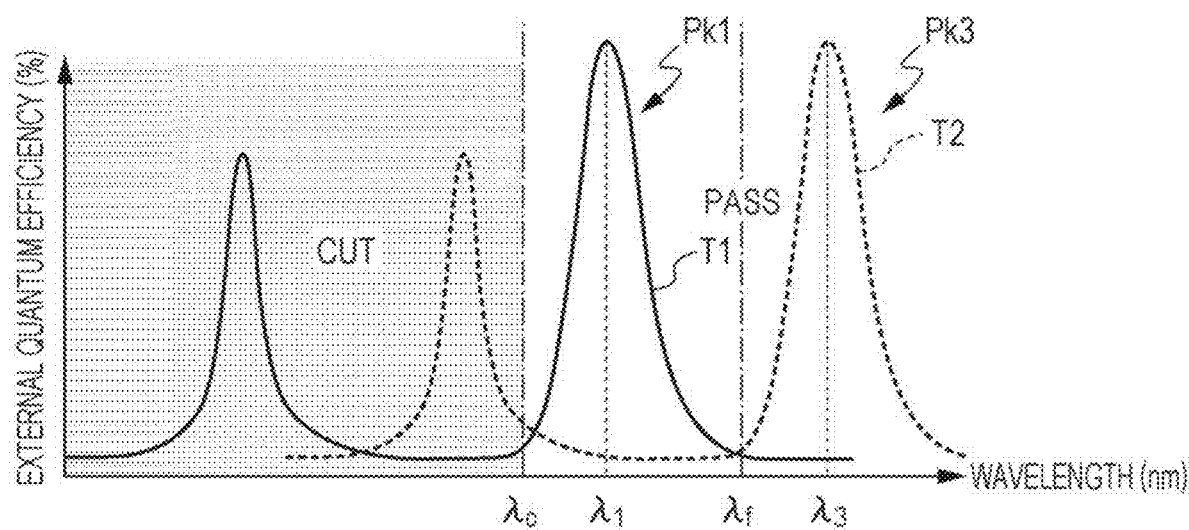
FIG. 15 illustrates an effective spectral sensitivity characteristic of a pixel Px2.

When focused on the pixel Px2 illustrated in FIG. 13, because the long-pass filter 60 is positioned in front of the photoelectric conversion layer 10B in the pixel Px2, light having a wavelength less than the cut-on wavelength λc of the long-pass filter 60 is substantially not incident on the photoelectric conversion layer 10B of the pixel Px2. As described above with reference to FIG. 14, the photoelectric conversion layer 10B includes the first photoelectric conversion material, which has the first peak Pk1 at a wavelength longer than the cut-on wavelength λc of the long-pass filter 60, and the second photoelectric conversion material, which has the third peak Pk3 at a wavelength longer than the cut-on wavelength λc. Accordingly, as schematically illustrated in FIG. 15, the pixel Px2 has a spectral sensitivity characteristic that specifically has sensitivities at the first wavelength λ1 and the third wavelength λ3.

Figure 16:
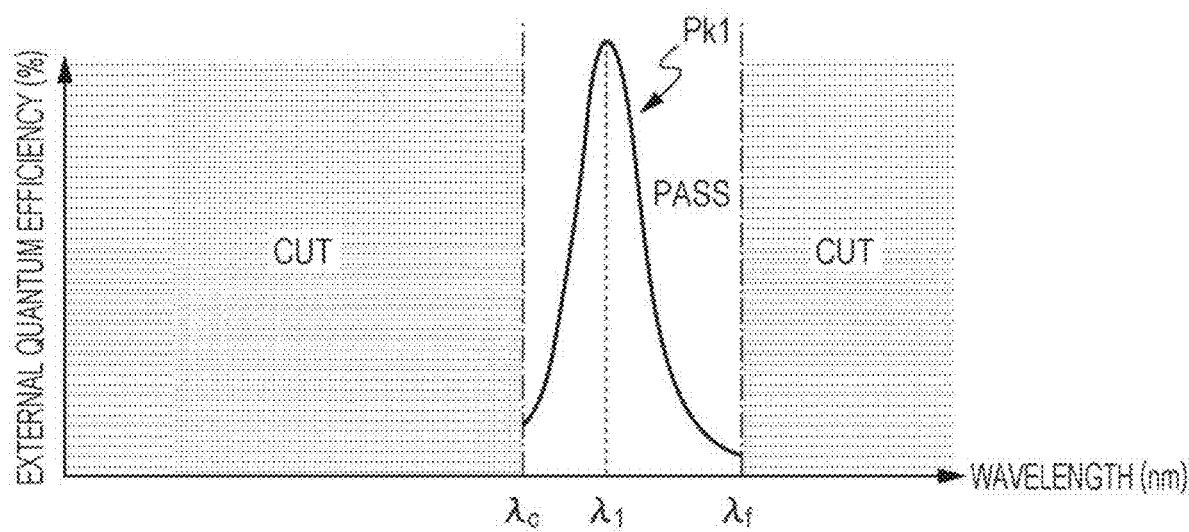
FIG. 16 illustrates an effective spectral sensitivity characteristic of a pixel Px1.

On the other hand, when focused on the pixel Px1 in FIG. 13, in the pixel Px1, both of the long-pass filter 60 and the short-pass filter 62 are disposed in front of the photoelectric conversion layer 10B. Therefore, light having a wavelength less than the cut-on wavelength λc of the long-pass filter 60 and light having a wavelength greater than the cut-off wavelength λf of the short-pass filter 62 are substantially not incident on the photoelectric conversion layer 10B of the pixel Px1. Accordingly, as schematically illustrated in FIG. 16, the pixel Px1 has a spectral sensitivity characteristic that specifically has a sensitivity at the first wavelength λ1.

Thus, the photoelectric conversion layer may be intentionally made to include two types of materials that differ in the position of absorption peak and that exhibit a quantum confinement effect, and the short-pass filter 62 may be disposed in front of the photoelectric conversion layers of some of the pixels. As in this example, by disposing pixels having different spectral sensitivity characteristics in an imaging region, it is possible to simultaneously obtain image signals about two bands. For example, if the first wavelength λ1 is in a visible range and the third wavelength λ3 is in an infrared range, it is possible to obtain an image signal about visible light and infrared light from the pixel Px2 and to obtain an image signal about visible light from the pixel Px1. An image signal about infrared light may be obtained from the difference between these image signals. Alternatively, when the first wavelength λ1 and the third wavelength λ3 are in an infrared range, it is possible to obtain, for example, an image signal about light having a wavelength of 940 nm and an image signal about light having a wavelength of 1.4 µm while maintaining simultaneity. The short-pass filter 62 need not be disposed for each pixel, and may be provided for a plurality of pixels. A half of the entirety of the imaging region may be covered by the short-pass filter 62.

(Camera System)

Figure 17:
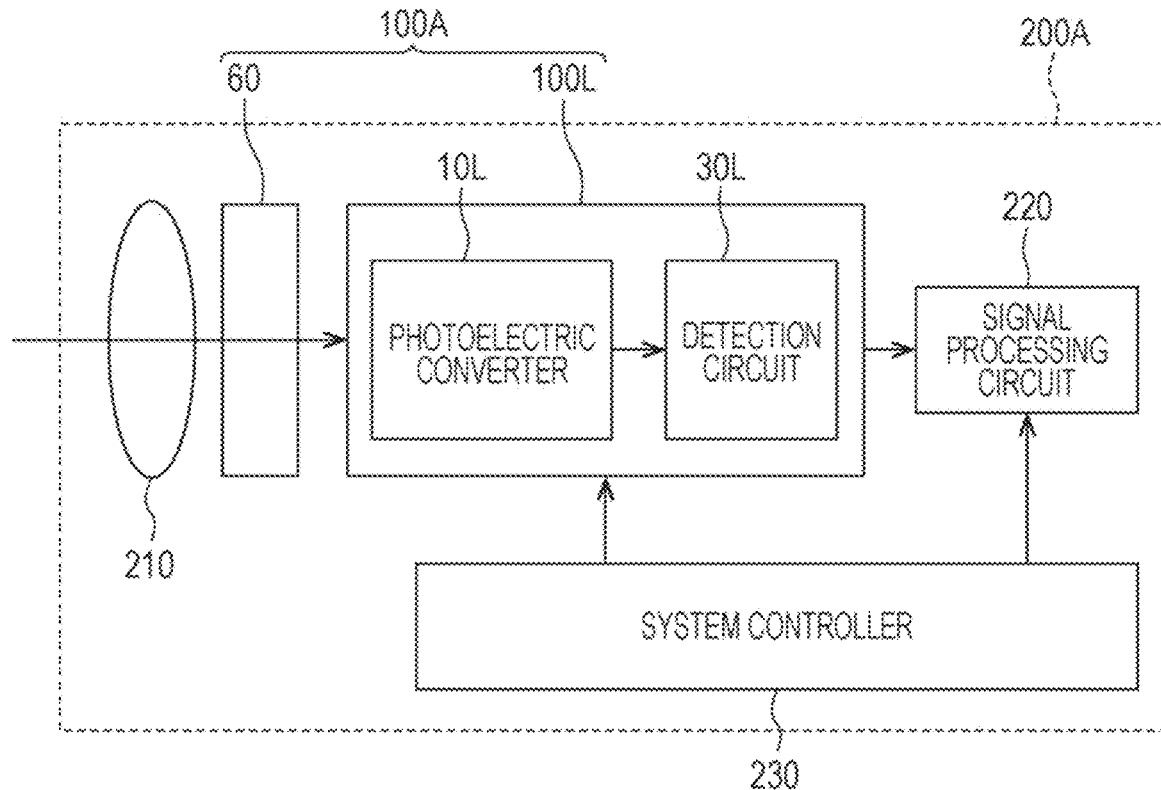
FIG. 17 is a schematic view illustrating an exemplary configuration of a camera system including a light sensor according to an embodiment of the present disclosure.

FIG. 17 schematically illustrates an exemplary configuration of a camera system including a light sensor according to an embodiment of the present disclosure. A camera system 200A illustrated in FIG. 17 includes a lens optical system 210, an imaging unit 100L, the long-pass filter 60 positioned between the lens optical system 210 and the imaging unit 100L, a system controller 230, and a signal processing circuit 220. The imaging unit 100L includes, for example, the photoelectric converter 10L and the detection circuit 30L described above. That is, the camera system 200A includes the light sensor 100A. Instead of the light sensor 100A, the camera system 200A may include the light sensor 100B, which has been described with reference to FIG. 13.

The lens optical system 210 includes, for example, an autofocus lens, a zoom lens, and a diaphragm. The lens optical system 210 focuses light onto an imaging plane of the imaging unit 100L. The signal processing circuit 220 processes an output signal from the imaging unit 100L. The signal processing circuit 220 performs, for example, gamma correction, color interpolation, spatial interpolation, automatic white balance, and the like. Depending on the use of the camera system 200A, the signal processing circuit 220 performs distance measurement calculation, wavelength information separation, and the like. The signal processing circuit 220 can be implemented in, for example, a digital signal processor (DSP), an image signal processor (ISP), a field-programmable gate array (FPGA), or the like. The signal processing circuit 220 may include one or more memories.

The system controller 230 controls the entirety of the camera system 200A. The system controller 230 can be implemented in, for example, a microcontroller. The system controller 230 may include one or more memories.

As described above, a light sensor according to an embodiment of the present disclosure can perform narrow-band imaging. Accordingly, with an embodiment of the present disclosure, it is possible to provide, at comparatively low cost, the camera system 200A that can perform narrow-band imaging and that has high precision and high robustness.

Figure 18:
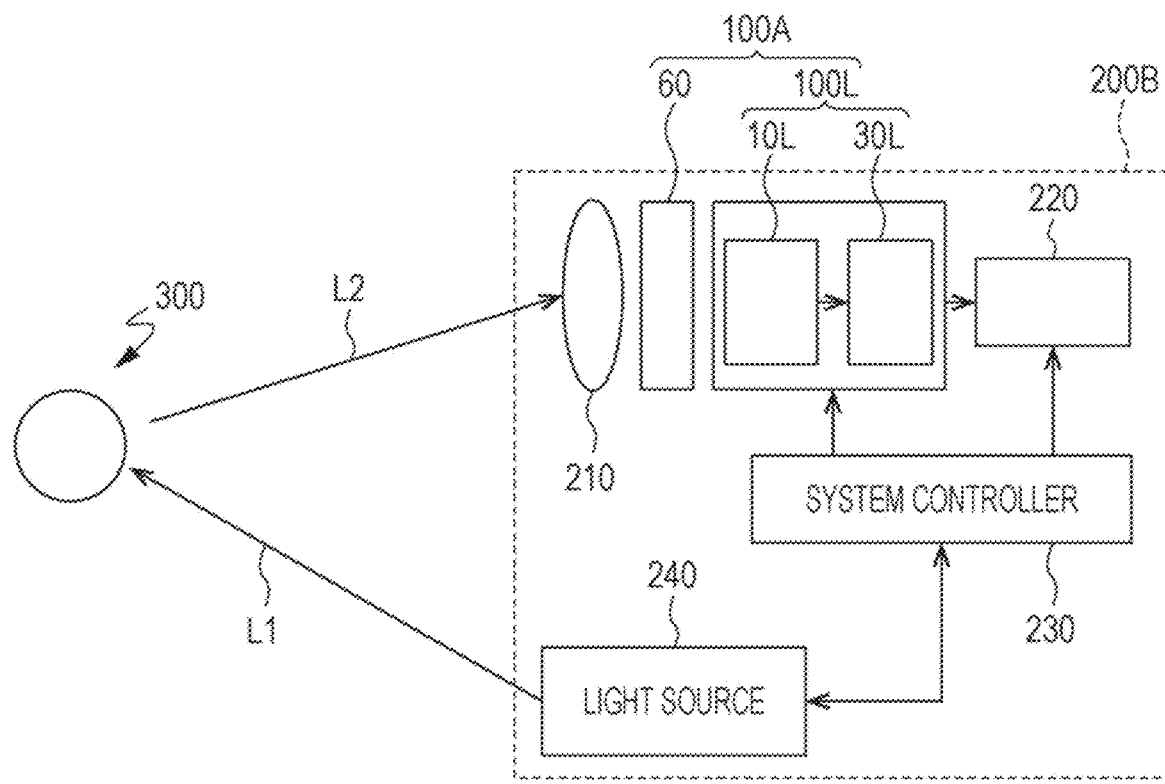
FIG. 18 is a schematic view illustrating another exemplary configuration of a camera system.

FIG. 18 illustrates another example of a camera system. A camera system 200B illustrated in FIG. 18 includes the lens optical system 210, the light sensor 100A, the system controller 230, the signal processing circuit 220, and a light source 240. That is, the camera system 200B has a configuration such that the light source 240 is added to the camera system 200A illustrated in FIG. 17. As with the camera system 200A, the camera system 200B may include the light sensor 100B instead of the light sensor 100A. The camera system 200B is an example of a light detection system of the present disclosure.

In the configuration illustrated in FIG. 18, the light source 240 emits illumination light L1 toward a subject 300, and the light sensor 100A performs imaging based on reflected light L2 from the subject 300. The light source 240 and the imaging unit 100L of the light sensor 100A are synchronously operated based on an instruction from the system controller 230.

The light sensor 100A of the camera system 200B includes the photoelectric conversion layer 10 and the long-pass filter 60, and thus can obtain an image about light having a specific wavelength. Accordingly, by emitting light having the first wavelength λ1 from the light source 240 and by performing imaging with the light sensor 100A, it is possible to obtain a bright image about light that is included in the reflected light L2 from the subject 300 and that has the first wavelength λ1.

As described above with reference to FIG. 22, the spectral sensitivity characteristic of a photodiode using a solid crystal may change depending on ambient temperature. Likewise, the peak wavelength of the illumination light L1 may shift due to an effect of ambient temperature. If such a wavelength shift occurs, effective sensitivity may decrease. Although it may be possible to compensate for the effect of decrease of effective sensitivity due to the wavelength shift by, for example, increasing the output power of the light source 240, doing so is disadvantageous in power consumption.

Thus, the full width at half maximum of the first peak Pk1 may be as wide as from about 200 nm to 300 nm. In a typical embodiment of the present disclosure, because the photoelectric converter 10L is not a photodiode made of a solid crystal, the temperature dependency of spectral sensitivity is low. Accordingly, by fixing beforehand a wavelength range in which the photoelectric conversion layer has sensitivity to a wide range in consideration of the temperature dependency of the light source 240, it is possible to reduce an effect due to change in temperature at a peak of the emission spectrum of the light source side, and, for example, to effectively use a wavelength in a gap in the spectrum of sunlight. The full width at half maximum of a light emission peak of the light source of the camera system according to an embodiment of the present disclosure may be wider than the full width at half maximum of the first peak Pk1.

By selecting a wavelength in a gap in the spectrum of sunlight as the first wavelength λ1, it is possible to perform imaging in which an effect due to disturbance light is reduced. In this case, the light source 240 may be an infrared light source. An infrared laser may be used as the light source 240. In particular, a light source that emits light in a wavelength range around 1.4 micrometers, which is called an eyesafe light source, can be advantageously used as the light source 240.

Figure 19:
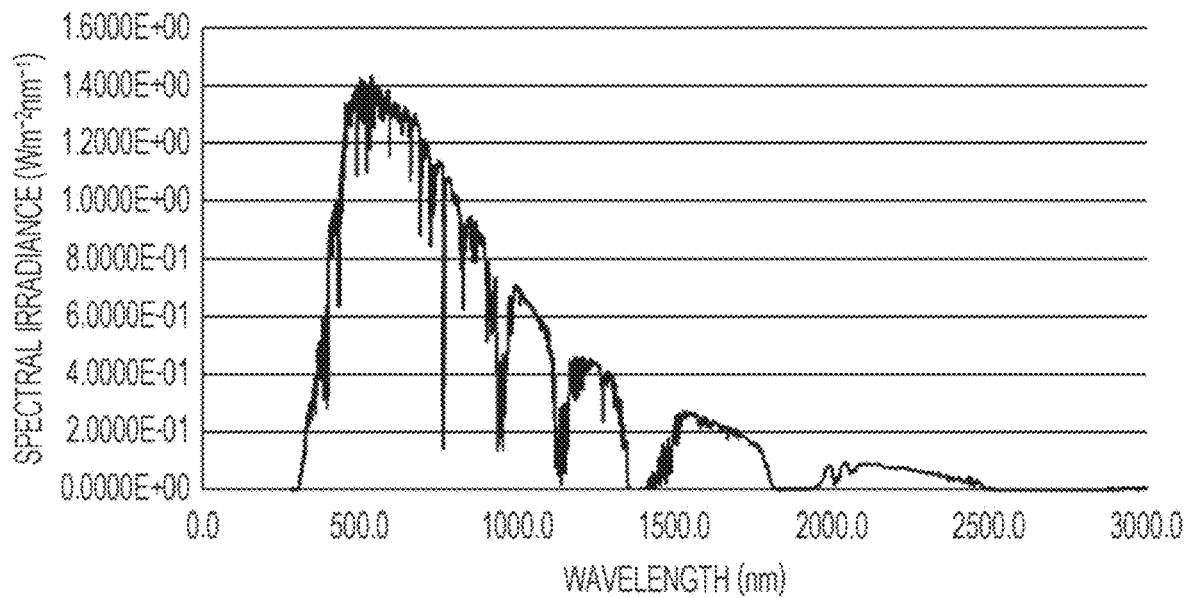
FIG. 19 illustrates the spectrum of sunlight.
Figure 20:
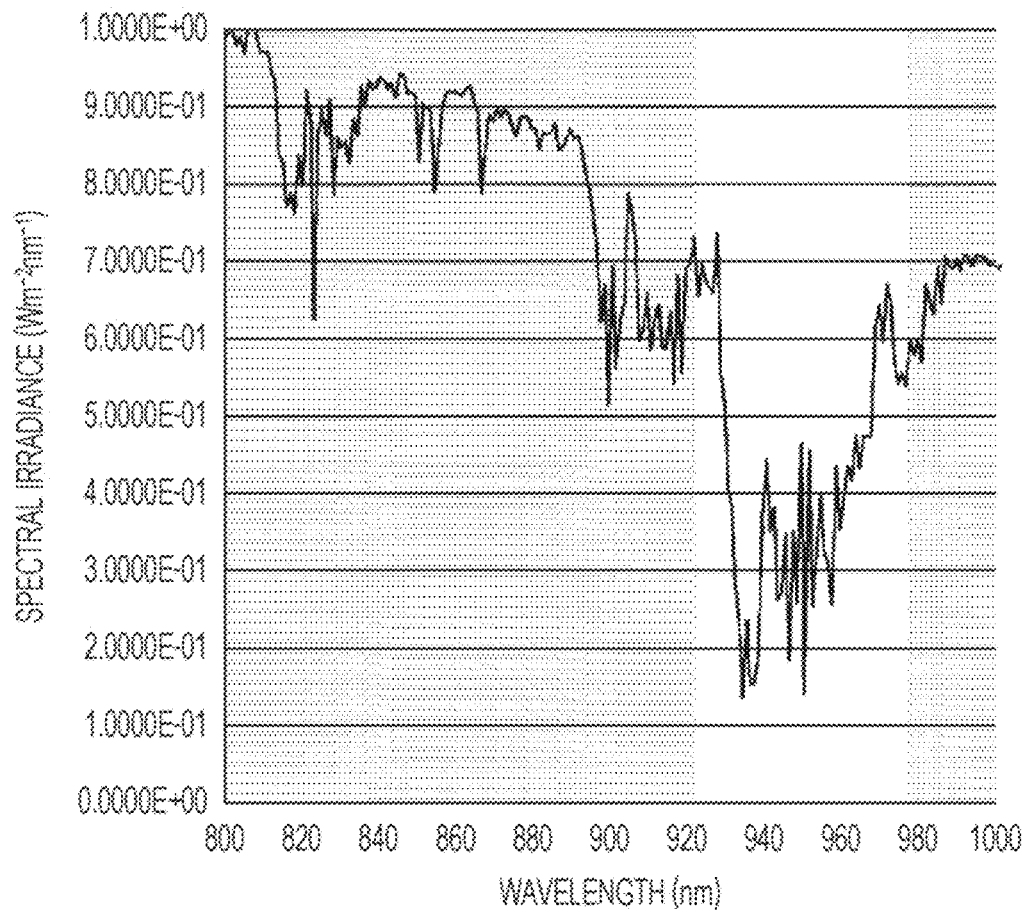
FIG. 20 illustrates enlargement of a part of the spectrum illustrated FIG. 19.

FIG. 19 illustrates the spectrum of sunlight. FIG. 20 illustrates an enlargement of a part of the spectrum illustrated in FIG. 19. When the spectrum of sunlight is observed on the ground, as schematically illustrated in FIG. 19, it can be seen that gaps exist at some wavelengths in the spectrum due to absorption by the atmosphere and water in the atmosphere. Accordingly, by performing imaging by using light having a wavelength in a gap in the spectrum of sunlight, in particular, by performing imaging by emitting light toward a subject from an active light source, such as the light source 240 of the camera system 200B, it is possible to perform imaging from which an effect of noise due to environmental light such as sunlight is maximally removed.

An example of wavelength at which an effect of disturbance by sunlight is small is around 940 nm. As illustrated in FIG. 20, in the spectrum of sunlight, the value of spectral irradiance around 920 to 980 nm is comparatively small. Although the effect from sunlight can be further reduced at around 1400 nm as described below, light having a wavelength around 920 to 980 nm is absorbed by the atmosphere by a comparative small amount, and accordingly an advantage is obtained in that an effect of attenuation is comparatively small when the light is used as the illumination light L1. Moreover, the light is advantageous in that constraint on the configuration of an imaging unit on the light-receiving side is small.

It is possible to perform imaging in which an effect of noise such as sunlight is reduced by setting, in the aforementioned range of 920 to 980 nm, the lower limit of wavelength at which the light sensor 100A or the light sensor 100B has sensitivity, which is determined by the cut-on wavelength λc of the long-pass filter 60, and the sensitivity cut-off wavelength that is determined by the material of the photoelectric conversion layer. The wavelength range shown by a region that is not hatched in FIG. 20 is an example of a wavelength range that can be used as the first wavelength λ1 when the camera system 200B is used for narrow-band imaging. A wavelength range at which the light sensor 100 or the light sensor 100B has sensitivity may be, for example, wider than or narrower than the wavelength range around 940 nm illustrated in FIG. 20.

Figure 21:
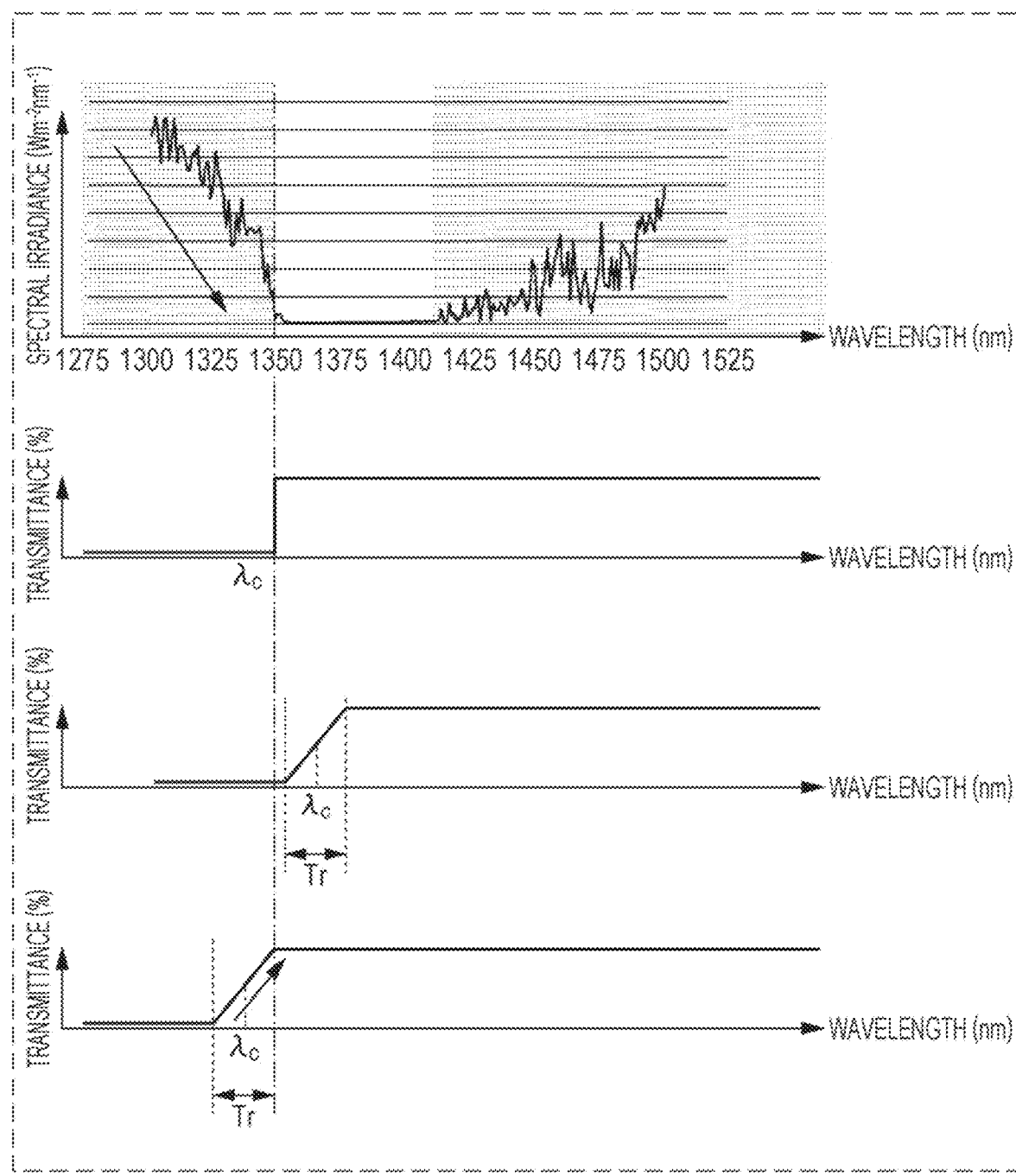
FIG. 21 illustrates a spectrum about sunlight and an example of a transmission spectrum about a long-pass filter.

As the first wavelength λ1 at which the photoelectric conversion layer 10 or the photoelectric conversion layer 10B has a particular absorption peak, a wavelength range of greater than or equal to 1300 nm and less than or equal to 1500 nm may be selected. FIG. 21 illustrates a spectrum about sunlight and an example of a transmission spectrum about the long-pass filter 60. It can be seen from FIG. 21 that, in the spectrum of sunlight, the spectral irradiance in a wavelength range around 1350 nm to 1400 nm is particularly small, because absorption in the atmosphere is larger than that at a wavelength around 940 nm. Accordingly, by using a wavelength around 1350 nm to 1400 nm as the first wavelength λ1, it is possible to perform imaging from which noise due to environmental light is further reduced.

However, in the wavelength range from around 1350 nm to 1400 nm, attenuation of the illumination light L1 and the reflected light L2 due to absorption in the atmosphere may be considerably large, compared with a wavelength around 940 nm. As necessary, imaging such that attenuation of light at the first wavelength λ1 is suppressed while reducing noise due to environmental light may be performed by shifting the lower limit of a wavelength range in which the light sensor 100 or the light sensor 100B have sensitivity to a wavelength shorter than 1350 nm or by shifting the upper limit of a wavelength range in which the light sensor 100 or the light sensor 100B have sensitivity to a wavelength longer than 1400 nm.

The second graph from the top of FIG. 21 schematically illustrates an ideal transmission spectrum about the long-pass filter 60. In the ideal example illustrated in the second graph from the top of FIG. 21, transmittance rises like a step at the cut-on wavelength λc. However, in reality, as illustrated in the third and fourth graphs from the top of FIG. 21, the graph of the transmittance of a long-pass filter has a finite transition range Tr while the value of transmittance changes from near-zero transmittance to an average transmittance. As illustrated in the third graph from the top of FIG. 21, in the transmission spectrum of the long-pass filter 60, the transition range Tr may be positioned at wavelengths longer than the lower limit of the target wavelength range of narrow-band imaging. However, in view of more effective use of a wavelength range in a gap in the spectrum of sunlight, it is more advantageous if the transition range Tr is positioned at wavelengths shorter than the lower limit of the target wavelength range of narrow-band imaging.

In this case, although the light sensor may have sensitivity at wavelengths shorter than 1350 nm, when focused on the sunlight spectrum, the spectral irradiance about sunlight decreases toward a wavelength around 1350 nm. Therefore, as in the example illustrated in the fourth graph from the top of FIG. 21, even if a rising part of the transmission spectrum of the long-pass filter 60 is positioned at wavelengths shorter than 1350 nm, because the decreasing wavelength dependency of the spectral irradiance of sunlight and the increasing wavelength dependency of the transmittance of the long-pass filter 60 cancel out, it is possible to restrict the effective sensitivity of the light sensor at wavelengths shorter than 1350 nm to a low level. As a result, it is possible to effectively use a wider wavelength range in a gap in the spectrum of sunlight.

Thus, also by making the target wavelength range in narrow-band imaging in the range of, for example, from 1300 to 1500 nm, it is possible to perform imaging from which the effect of noise due to sunlight and the like is reduced. The aforementioned wavelengths are mere examples, and 850 nm, 1900 nm, 2700 nm, or a longer wavelength may be used as the first wavelength λ1. In particular, it is possible to advantageously perform narrow-band imaging by using a desirable wavelength in a gap in the sunlight spectrum, for example, by making the full width at half maximum of the first peak Pk1 of the spectral sensitivity curve be less than or equal to 200 nm or by making the width of the first peak Pk1 at a position where the spectral sensitivity is 10% of the spectral sensitivity at the first wavelength λ1 be less than or equal to 200 nm.

Narrow-band imaging using a wavelength in a gap in the spectrum of sunlight can be advantageously used for time-of-flight (TOF) distance measurement, structured-illumination distance measurement, and the like. The term "structured-illumination distance measurement" refers to a distance measuring method based on triangulation, and has applications to three-dimensional shape measurement and the like. Examples of a method applied to structured-illumination distance measurement include a light-cut method. Imaging using the light sensor 100A or the light sensor 100B and the active light source 240 that is synchronized with the light sensor 100A or the light sensor 100B include a wide range of imaging in which measurement is performed based on light emitted from the light source 240 and reflected from the subject 300.

Embodiments of the present disclosure can be used, for example, for various cameras and camera systems such as a medical camera, a security camera, a vehicle-mounted camera, a distance-measuring camera, a microscope camera, a camera for an unmanned plane called a drone, and a robot camera. The vehicle-mounted camera is used, for example, as input to a control device for driving a vehicle safely. Alternatively, the vehicle-mounted camera may be used to assist an operator in safely driving a vehicle.

What is claimed is:

1. A light sensor comprising:
   a first electrode;
   a second electrode;
   a photoelectric conversion layer between the first electrode and the second electrode; and
   a long-pass filter that is disposed above the photoelectric conversion layer and that selectively transmits incident light having a wavelength longer than or equal to a cut-on wavelength of the long-pass filter, wherein
   the photoelectric conversion layer has a spectral sensitivity characteristic having a first peak at a first wavelength that is longer than the cut-on wavelength, and
   a spectral sensitivity of the photoelectric conversion layer at the cut-on wavelength is greater than or equal to 0% and less than or equal to 50% of a spectral sensitivity of the photoelectric conversion layer at the first wavelength.

2. The light sensor according to claim 1,
   wherein the spectral sensitivity of the photoelectric conversion layer at the cut-on wavelength is greater than or equal to 0% and less than or equal to 30% of the spectral sensitivity of the photoelectric conversion layer at the first wavelength.

3. The light sensor according to claim 2,
   wherein the spectral sensitivity of the photoelectric conversion layer at the cut-on wavelength is greater than or equal to 0% and less than or equal to 10% of the spectral sensitivity of the photoelectric conversion layer at the first wavelength.

4. The light sensor according to claim 1,
   wherein a full width at half maximum of the first peak is less than or equal to 200 nm.

5. The light sensor according to claim 4,
   wherein a width of the first peak at a position where a spectral sensitivity is 10% of the spectral sensitivity at the first wavelength is less than or equal to 200 nm.

6. The light sensor according to claim 1, wherein
   the spectral sensitivity characteristic has a plurality of peaks including the first peak, and
   the first peak is a peak that is positioned at a longest wavelength among the plurality of peaks.

7. The light sensor according to claim 6, wherein
   the plurality of peaks include a second peak positioned at a second wavelength,
   the second wavelength is shorter than the cut-on wavelength of the long-pass filter, and
   the second peak is a peak that is positioned at a second longest wavelength among the plurality of peaks.

8. The light sensor according to claim 7,
   wherein a difference between the first wavelength and the cut-on wavelength is less than a difference between the cut-on wavelength and the second wavelength.

9. The light sensor according to claim 1,
   wherein the photoelectric conversion layer contains a carbon nanotube.

10. The light sensor according to claim 1,
    wherein the photoelectric conversion layer contains a quantum dot.

11. The light sensor according to claim 1,
    wherein the first wavelength is longer than or equal to 1300 nm and shorter than or equal to 1500 nm.

12. The light sensor according to claim 1,
    wherein the long-pass filter is an absorptive optical filter.

13. The light sensor according to claim 1, further comprising voltage supply circuitry that is configured to supply a voltage between the first electrode and the second electrode.

14. The light sensor according to claim 1, wherein the first electrode is configured to collect a signal charge generated in the photoelectric conversion layer.

15. A light detection system comprising:
    a light source that emits light toward a subject; and
    a light sensor that detects light from the subject,
    wherein the light sensor includes:
      a first electrode;
      a second electrode;
      a photoelectric conversion layer between the first electrode and the second electrode, and
      a long-pass filter that is disposed above the photoelectric conversion layer and that selectively transmits incident light having a wavelength longer than or equal to a cut-on wavelength of the long-pass filter, wherein
    the photoelectric conversion layer has a spectral sensitivity characteristic having a first peak at a first wavelength that is longer than the cut-on wavelength,
    a spectral sensitivity of the photoelectric conversion layer at the cut-on wavelength is greater than or equal to 0% and less than or equal to 50% of a spectral sensitivity of the photoelectric conversion layer at the first wavelength, and
    the light source emits light having the first wavelength.

16. The light detection system according to claim 15,
    wherein a full width at half maximum of the first peak is greater than or equal to 200 nm and less than or equal to 300 nm.

17. The light detection system according to claim 15, wherein a full width at half maximum of an emission peak of light emitted by the light source is greater than a full width at half maximum of the first peak.

18. The light detection system according to claim 15, further comprising voltage supply circuitry that is configured to supply a voltage between the first electrode and the second electrode.

19. The light detection system according to claim 15, wherein the first electrode is configured to collect a signal charge generated in the photoelectric conversion layer.

* * * * *